United States Patent
Sinsheimer

(10) Patent No.: US 9,594,114 B2
(45) Date of Patent: Mar. 14, 2017

(54) STRUCTURE FOR TRANSMITTING SIGNALS IN AN APPLICATION SPACE BETWEEN A DEVICE UNDER TEST AND TEST ELECTRONICS

(71) Applicant: Teradyne, Inc., North Reading, MA (US)

(72) Inventor: Roger Allen Sinsheimer, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 305 days.

(21) Appl. No.: 14/316,164

(22) Filed: Jun. 26, 2014

(65) Prior Publication Data
US 2015/0377946 A1    Dec. 31, 2015

(51) Int. Cl.
*G01R 31/01* (2006.01)
*G01R 31/28* (2006.01)
*G01R 31/319* (2006.01)

(52) U.S. Cl.
CPC ... *G01R 31/2889* (2013.01); *G01R 31/31905* (2013.01); *G01R 31/31926* (2013.01)

(58) Field of Classification Search
CPC ...... G01R 1/073; G01R 1/07364; G01R 3/00; G01R 31/01; G01R 31/2874; G01R 31/2601
USPC ........................................ 324/756.03, 755.02
See application file for complete search history.

(56) References Cited

U.S. PATENT DOCUMENTS

| | | |
|---|---|---|
| 3,516,077 A | 6/1970 | Bobeck et al. |
| 3,577,131 A | 5/1971 | Morrow et al. |
| 3,673,433 A | 6/1972 | Kupfer |
| 3,934,236 A | 1/1976 | Aiken et al. |
| 4,021,790 A | 5/1977 | Aiken et al. |
| 4,117,543 A | 9/1978 | Minnick et al. |
| 4,692,839 A | 9/1987 | Lee et al. |
| 4,729,166 A | 3/1988 | Lee et al. |
| 4,754,546 A | 7/1988 | Lee et al. |
| 4,757,256 A | 7/1988 | Whann et al. |
| 4,758,785 A | 7/1988 | Rath |
| 4,778,950 A | 10/1988 | Lee et al. |

(Continued)

FOREIGN PATENT DOCUMENTS

| | | |
|---|---|---|
| EP | 0298219 | 1/1989 |
| EP | 0361779 | 4/1990 |

(Continued)

OTHER PUBLICATIONS

PCT International Search Report and Written Opinion for PCT/US2015/036213 mailed Sep. 25, 2015 (9 pp).

(Continued)

*Primary Examiner* — Tung X Nguyen
*Assistant Examiner* — Robert P Alejnikov, Jr.
(74) *Attorney, Agent, or Firm* — Choate, Hall & Stewart LLP; Paul Pysher

(57) ABSTRACT

An example structure for transmitting signals in an application space between a device under test (DUT) and test electronics includes: a circuit board that is part of an application space between test electronics and a device under test (DUT); and a coaxial structure to pass signals along electrical pathways between the test electronics and the DUT. The coaxial structure includes a signal line at least partially surrounded by a return line.

27 Claims, 12 Drawing Sheets

(56) References Cited

U.S. PATENT DOCUMENTS

| | | | |
|---|---|---|---|
| 4,804,132 A | 2/1989 | DiFrancesco |
| 4,912,399 A | 3/1990 | Greub et al. |
| 4,918,383 A | 4/1990 | Huff et al. |
| 4,920,574 A * | 4/1990 | Yamamoto | H01L 23/4332 165/80.4 |
| 4,922,192 A | 5/1990 | Gross et al. |
| 4,954,873 A | 9/1990 | Lee et al. |
| 4,975,638 A | 12/1990 | Evans et al. |
| 4,980,637 A | 12/1990 | Huff et al. |
| 5,020,219 A | 6/1991 | Leedy |
| 5,072,176 A | 12/1991 | Miller et al. |
| 5,083,697 A | 1/1992 | Difrancesco |
| 5,103,557 A | 4/1992 | Leedy |
| 5,132,613 A | 7/1992 | Papae et al. |
| 5,180,977 A | 1/1993 | Huff |
| 5,264,787 A | 11/1993 | Woith et al. |
| 5,355,079 A | 10/1994 | Evans et al. |
| 5,378,982 A | 1/1995 | Feigenbaum et al. |
| 5,416,429 A | 5/1995 | McQuade et al. |
| 5,422,574 A | 6/1995 | Kister |
| 5,456,404 A | 10/1995 | Robinette, Jr. et al. |
| 5,468,157 A | 11/1995 | Roebuck et al. |
| 5,469,072 A | 11/1995 | Williams et al. |
| 5,623,213 A | 4/1997 | Liu et al. |
| 5,914,613 A | 6/1999 | Gleason et al. |
| 5,968,282 A | 10/1999 | Yamasaka |
| 5,973,405 A | 10/1999 | Keukelaar et al. |
| 6,246,245 B1 | 6/2001 | Akram et al. |
| 6,256,882 B1 | 7/2001 | Gleason et al. |
| 6,307,387 B1 | 10/2001 | Gleason et al. |
| 6,356,098 B1 | 3/2002 | Akram et al. |
| 6,359,337 B1 | 3/2002 | Keukelaar et al. |
| 6,437,584 B1 | 8/2002 | Gleason et al. |
| 6,499,216 B1 | 12/2002 | Fjelstad |
| 6,566,898 B2 | 5/2003 | Theissen et al. |
| 6,578,264 B1 | 6/2003 | Gleason et al. |
| 6,586,955 B2 | 7/2003 | Fjelstad et al. |
| 6,633,175 B1 | 10/2003 | Evans et al. |
| 6,661,244 B2 | 12/2003 | McQuade et al. |
| 6,686,732 B2 | 2/2004 | Parrish |
| 6,690,186 B2 | 2/2004 | Fjelstad |
| 6,708,386 B2 | 3/2004 | Gleason et al. |
| 6,756,797 B2 | 6/2004 | Brandorff et al. |
| 6,825,677 B2 | 11/2004 | Gleason et al. |
| 6,838,890 B2 | 1/2005 | Tervo et al. |
| 6,860,009 B2 | 3/2005 | Gleason et al. |
| 6,911,835 B2 | 6/2005 | Chraft et al. |
| 6,927,585 B2 | 8/2005 | Gleason et al. |
| 6,927,586 B2 | 8/2005 | Thiessen |
| 6,930,498 B2 | 8/2005 | Tervo et al. |
| 6,965,244 B2 | 11/2005 | Miller |
| 7,084,657 B2 | 8/2006 | Matsumura |
| 7,109,731 B2 | 9/2006 | Gleason et al. |
| 7,148,711 B2 | 12/2006 | Tervo et al. |
| 7,161,363 B2 | 1/2007 | Gleason et al. |
| 7,178,236 B2 | 2/2007 | Gleason et al. |
| 7,227,371 B2 | 6/2007 | Miller |
| 7,233,160 B2 | 6/2007 | Hayden et al. |
| 7,266,889 B2 | 9/2007 | Gleason et al. |
| 7,271,603 B2 | 9/2007 | Gleason et al. |
| 7,285,969 B2 | 10/2007 | Hayden et al. |
| 7,304,488 B2 | 12/2007 | Gleason et al. |
| 7,355,420 B2 | 4/2008 | Smith et al. |
| 7,368,927 B2 | 5/2008 | Smith et al. |
| 7,400,155 B2 | 7/2008 | Gleason et al. |
| 7,403,025 B2 | 7/2008 | Tervo et al. |
| 7,403,028 B2 | 7/2008 | Campbell |
| 7,417,446 B2 | 8/2008 | Hayden et al. |
| 7,420,381 B2 | 9/2008 | Burcham et al. |
| 7,427,868 B2 | 9/2008 | Strid et al. |
| 7,436,194 B2 | 10/2008 | Gleason et al. |
| 7,443,181 B2 | 10/2008 | Miller |
| 7,443,186 B2 | 10/2008 | Strid et al. |
| 7,449,899 B2 | 11/2008 | Campbell et al. |
| 7,453,275 B2 | 11/2008 | Yamaguchi |
| 7,453,276 B2 | 11/2008 | Hayden et al. |
| 7,456,646 B2 | 11/2008 | Hayden et al. |
| 7,482,823 B2 | 1/2009 | Gleason et al. |
| 7,489,149 B2 | 2/2009 | Gleason et al. |
| 7,492,175 B2 | 2/2009 | Smith et al. |
| 7,495,461 B2 | 2/2009 | Hayden et al. |
| 7,498,829 B2 | 3/2009 | Gleason et al. |
| 7,501,842 B2 | 3/2009 | Gleason et al. |
| 7,504,842 B2 | 3/2009 | Schwindt |
| 7,514,944 B2 | 4/2009 | Smith et al. |
| 7,518,387 B2 | 4/2009 | Gleason et al. |
| 7,533,462 B2 | 5/2009 | Gleason et al. |
| 7,535,247 B2 | 5/2009 | Andrews et al. |
| 7,541,821 B2 | 6/2009 | Gleason et al. |
| 7,601,039 B2 | 10/2009 | Eldridge et al. |
| 7,609,077 B2 | 10/2009 | Campbell et al. |
| 7,619,419 B2 | 11/2009 | Campbell |
| 7,656,172 B2 | 2/2010 | Andrews et al. |
| 7,681,312 B2 | 3/2010 | Gleason et al. |
| 7,688,097 B2 | 3/2010 | Hayden et al. |
| 7,723,999 B2 | 5/2010 | Strid et al. |
| 7,750,652 B2 | 7/2010 | Campbell |
| 7,759,953 B2 | 7/2010 | Strid et al. |
| 7,761,983 B2 | 7/2010 | Hayden et al. |
| 7,761,986 B2 | 7/2010 | Gleason et al. |
| 7,764,072 B2 | 7/2010 | Strid et al. |
| 7,764,075 B2 | 7/2010 | Miller |
| 7,791,361 B2 | 9/2010 | Karklin et al. |
| 7,800,001 B2 | 9/2010 | Hamada et al. |
| 7,876,114 B2 | 1/2011 | Campbell et al. |
| 7,888,957 B2 | 2/2011 | Smith et al. |
| 7,893,704 B2 | 2/2011 | Gleason et al. |
| 7,898,273 B2 | 3/2011 | Gleason et al. |
| 7,898,281 B2 | 3/2011 | Andrews et al. |
| 7,934,944 B2 | 5/2011 | Hamada et al. |
| 7,934,945 B2 | 5/2011 | Narita et al. |
| 7,940,069 B2 | 5/2011 | Andrews et al. |
| 8,013,623 B2 | 9/2011 | Burcham et al. |
| 8,033,838 B2 | 10/2011 | Eldridge et al. |
| 8,202,684 B2 | 6/2012 | Hamada et al. |
| 8,373,428 B2 | 2/2013 | Eldridge et al. |
| 8,410,806 B2 | 4/2013 | Smith |
| 8,451,017 B2 | 5/2013 | Gleason et al. |
| 2002/0195265 A1 * | 12/2002 | Miller | G01R 1/0466 174/70 R |
| 2003/0122538 A1 | 7/2003 | Parrish et al. |
| 2007/0004238 A1 * | 1/2007 | Breinlinger | H01R 13/2407 439/63 |
| 2007/0007980 A1 | 1/2007 | Miller et al. |
| 2007/0103199 A1 * | 5/2007 | Tzartzanis | H03K 3/356191 326/82 |
| 2008/0061808 A1 | 3/2008 | Mok et al. |
| 2009/0033347 A1 | 2/2009 | Mineo et al. |
| 2010/0231250 A1 * | 9/2010 | Breinlinger | G01R 1/0458 324/750.08 |
| 2012/0017428 A1 | 1/2012 | Hsu et al. |
| 2012/0094534 A1 * | 4/2012 | Motohashi | H01R 9/0527 439/585 |
| 2012/0175612 A1 | 7/2012 | Ding et al. |
| 2013/0135002 A1 | 5/2013 | Grover et al. |
| 2015/0137848 A1 * | 5/2015 | Lewinnek | G01R 31/2889 324/756.03 |

FOREIGN PATENT DOCUMENTS

| | | |
|---|---|---|
| WO | 88/05544 | 7/1988 |
| WO | 2013/134568 | 9/2013 |

OTHER PUBLICATIONS

Kister et al., "Test Cost Reduction Using the Membrane Probe", Probe Technology, Santa Clara, CA (at least before Apr. 22, 1997, the issue date of U.S. Pat. No. 5,623,213).

Kister et al., Test Cost Reduction Using the Membrane Probe, Probe Technology, Santa Clara, CA (at least before Apr. 22, 1997, the issue date of U.S. Pat. No. 5,623,213).

(56) References Cited

OTHER PUBLICATIONS

Fisher et al, "Reducing Test Costs for High-Speed and High Pin-Count Devices", Probe Technology, Feb. 1992, Santa Clara, CA.
*Fresh Quest Corporation*, "Fresh Quest Corporation Announces the Deliver of QC²™ Bare Die Carriers and QPC™ Probe Cards for the Production of Known Good Die", Chandler, AZ (at least before Apr. 22, 1997, the issue date of U.S. Pat. No. 5,623,213).
*Fresh Quest Corporation*, "Quest Pricing Guidelines" (at least before Apr. 22, 1997, the issue date of U.S. Pat. No. 5,623,213).
*Hewlett Packard*, "High Speed Wafer Probing with the HP 83000 Model F660", 1993, Germany.
*Hughes Aircraft Company*, "Additional Technical Data for Hughes' Membrane Test Probe", 1993.
*Hughes*, "Membrane Wafer Probe-The Future of the IC Test Industry" (at least before Apr. 22, 1997, the issue date of U.S. Pat. No. 5,623,213).
*Packard Hughes Interconnect*, "Science Over Art, Our New IC Membrane Test Probe", 1993, Irvine, CA.
Packard Hughes Interconnect, "Our New IC Membrane Test Probe. It's priced the Same, but It Costs Less.", 1993, Irvine, CA.
*Probe Technology*, "Membrane Probe Card-The Concept" (at least before Apr. 22, 1997, the issue date of U.S. Pat. No. 5,623,213).
*Probe Technology*, "Prober Interface Unit for HP83000 Model—INT768" (at least before Apr. 22, 1997, the issue date of U.S. Pat. No. 5,623,213).
Chong et al., "The Evolution of MCM Test from High Performance Bipolar Mainframe Multichip Modules to Low Cost Work Station Mulitchip Modules", *ICEMM Proceedings* '93, pp. 404-410.
Doane, D., "Foreword: Advancing MCM Technologies", *IEEE Transactions on Components, Packaging, and Manufacturing Technology—Part B: Advanced Packaging*, 17(1):1 (Feb. 1994).
Davidson, E., "Design, Analysis, Applications", *IEEE Transactions on Components, Packaging, Manufacturing Technology—Part B: Advanced Packaging*, 17(1):2 (Feb. 1994).
Russell, T., "Testing", *IEEE Transactions on Components, Packaging, Manufacturing Technology—Part B: Advanced Packaging*, 17(1):2 (Feb. 1994).
Marshall et al., "CAD-Based Net Capacitance Testing of Unpopulated MCM Substrates", *IEEE Transactions on Components, Packaging, Manufacturing Technology—Part B: Advanced Packaging*, 17(1):50-55 (Feb. 1994).
Economikos et al., "Electrical Test of Multichip Substrates", *IEEE Transactions on Components, Packaging, Manufacturing Technology—Part B: Advanced Packaging*, 17(1):56-61 (Feb. 1994).
Brunner et al., "Electron-Beam MCM Testing and Probing", *IEEE Transactions on Components, Packaging, Manufacturing Technology—Part B: Advanced Packaging* (1994).
West, et al., *Principles of CMOS VLSI Design: A Systems Perspective*, $2^{nd}$ Ed., Chapter 8 (1993).
Reid et al., "Micromachined Rectangular-Coaxial Transmission Lines", *IEEE Transactions on Microwave Theory and Techniques*, vol. 54, No. 8 (Aug. 2006).
Ralston et al., "Liquid-Metal Vertical Interconnects for Flip Chip Assembly of GaAs C-Band Power Amplifiers Onto Micro-Rectangular Coaxial Transmission Lines", *IEEE Journal of Solid-State Circuits*, vol. 47, No. 10 (Oct. 2012).
"New Product Release: Reliant Switch for better RF testing," DowKey.com, copyright 2010, retrieved on Feb. 3, 2015; http://www.dowkey.com/news_details.php?id= 110.
"Reliant Switch High Repeatability", DowKey.com, Data Sheet; retrieved on Feb. 3, 2015; http://www.dowkey.com/_news_attach_files/0/_plk121_1_Reliant_Switch_Datasheet.pdf.
International Search Report and Written Opinion; PCT/US2014/063646; Jan. 28, 2015; 15 pp.

\* cited by examiner

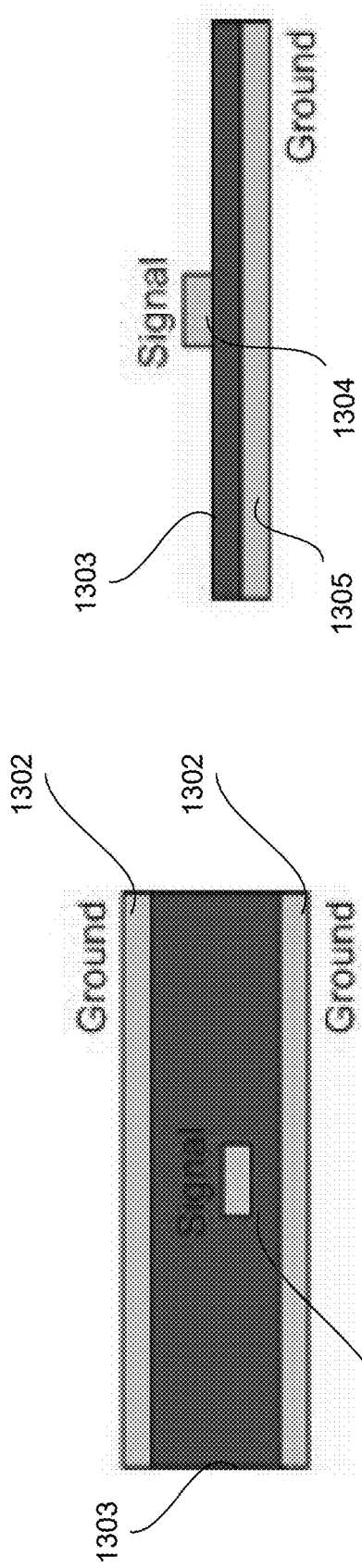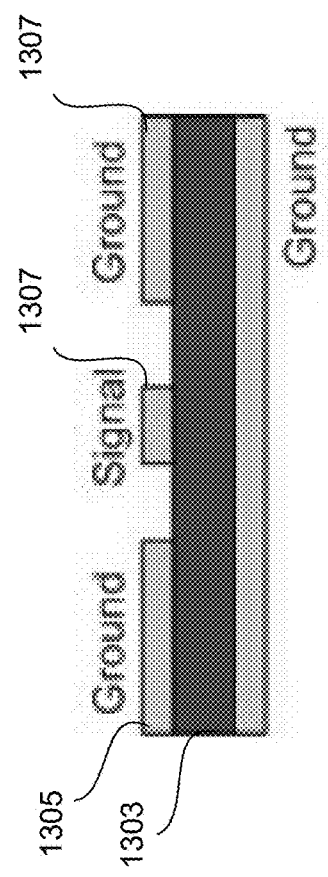
FIG. 12A
FIG. 12B
FIG. 12C

STRUCTURE FOR TRANSMITTING SIGNALS IN AN APPLICATION SPACE BETWEEN A DEVICE UNDER TEST AND TEST ELECTRONICS

TECHNICAL FIELD

This specification relates generally to a structure for transmitting signals in an application space between a device under test (DUT) and test electronics.

BACKGROUND

Wafer-level testing includes testing dice on a wafer. In this specification, "dice" is used as the plural of "die". A probe card may be used in testing dice on a wafer. Today's probe cards and packaged device test boards include a switching network to multiplex channels passing to and from devices being tested (e.g., radio transceivers for an RF probe card) down to a manageable number of channels that can be tested relatively quickly. These switching networks may be complex to design and may be finely-tuned to reduce their impact on the tests being performed. Such switching networks may be constructed of stripline layers within the probe card or packaged device test PCB (printed circuit board), as well as components on the surface of those boards connected with coplanar waveguides.

Test circuitry, such as the switching matrix, should have a good electrical path (e.g., low loss, low inductance, and low crosstalk) to test a die accurately.

SUMMARY

An example apparatus comprises: a circuit board that is part of an application space between test electronics and a device under test (DUT); and a coaxial structure to pass signals along electrical pathways between the test electronics and the DUT, where the coaxial structure comprises a signal line at least partially surrounded by a return line. The example apparatus may include one or more of the following features, either alone or in combination.

In the coaxial structure, the signal line may be completely surrounded by the return line. In the coaxial structure, the signal line may be at least partially surrounded by the return line. The coaxial structure may pass through the circuit board. The coaxial structure may comprise an additively-manufactured structure. The additively-manufactured structure may comprise a 3D-printed structure or a 2½ D printed structure. The coaxial structure may comprise a manufactured structure.

The DUT may comprise transceivers, each of which may comprise devices for transmitting and receiving signals. The coaxial structure may comprise a switching matrix for selecting transceiver channels for test.

The coaxial structure may comprise at least one of active elements or passive elements. The active elements or passive elements may be an integral part of the coaxial structure. The active elements or passive elements may comprise discrete components attached to integral parts of the coaxial structure.

The coaxial structure may comprise at least one channel for holding or transferring thermal transferring material. The at least one channel may be positioned to thermally impact an active or passive device associated with the application space. The thermal transmitting material passing through the channel or channels may be configured to stabilize a temperature of an active or passive device within the application space, where stabilizing comprises cooling or heating the device to maintain a target temperature.

An example system comprises: devices under test (DUTs); test electronics to test the DUTs; and a coaxial structure to pass signals along electrical pathways between the test electronics and the DUT, where the coaxial structure comprises a signal line at least partially surrounded by a return line. The example system may include one or more of the following features, either alone or in combination.

The coaxial structure may be a first coaxial structure. The system may comprise: a second coaxial structure to pass signals between the test electronics and the first coaxial structure; and a third coaxial structure to pass signals between the first coaxial structure and the DUTs.

The circuit board may comprise electrical elements arranged at a first pitch. The DUTs are on a wafer may comprise contacts arranged at a second pitch, where the second pitch is less than the first pitch. The third coaxial structure may comprise an interconnect comprising additively-manufactured electrical conduits that are part of an electrical pathway between the electrical elements and the contacts. The additively-manufactured electrical conduits may comprise electrically-conductive material. At least some of the additively-manufactured electrical conduits may be configured to have substantially matching electrical path lengths, impedance, and signal attenuation. The additively-manufactured electrical conduits may comprise curved or serpentine portions configured to achieve substantially matching electrical path lengths and time-of-flight, impedance, and signal attenuation between different additively-manufactured electrical conduits.

In the coaxial structure, the signal line may be completely surrounded by the return line. In the coaxial structure, the signal line may not be completely surrounded by the return line. The coaxial structure may comprise an additively-manufactured structure. The additively-manufactured structure may comprise a 3D-printed structure or a 2½ D printed structure. The coaxial structure may comprise a machined structure.

The DUT may comprise transceivers, each of which may comprise devices for transmitting and receiving signals. The coaxial structure may comprise a switching matrix for selected ones of the transceivers for test. The coaxial structure may comprise at least one of active elements or passive elements.

The active elements or passive elements may be an integral part of the coaxial structure. The active elements or passive elements may comprise discrete components attached to integral parts of the coaxial structure. The coaxial structure may comprise at least one channel for holding cooling liquid. The at least one channel may be positioned to thermally impact an active or passive element associated with testing of the DUT.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

FIGS. 12A, 12B and 12C show different manufacturing techniques for producing conductive conduits for the interconnect.

Like reference numerals in different figures indicate like elements.

DETAILED DESCRIPTION

Figure 1:
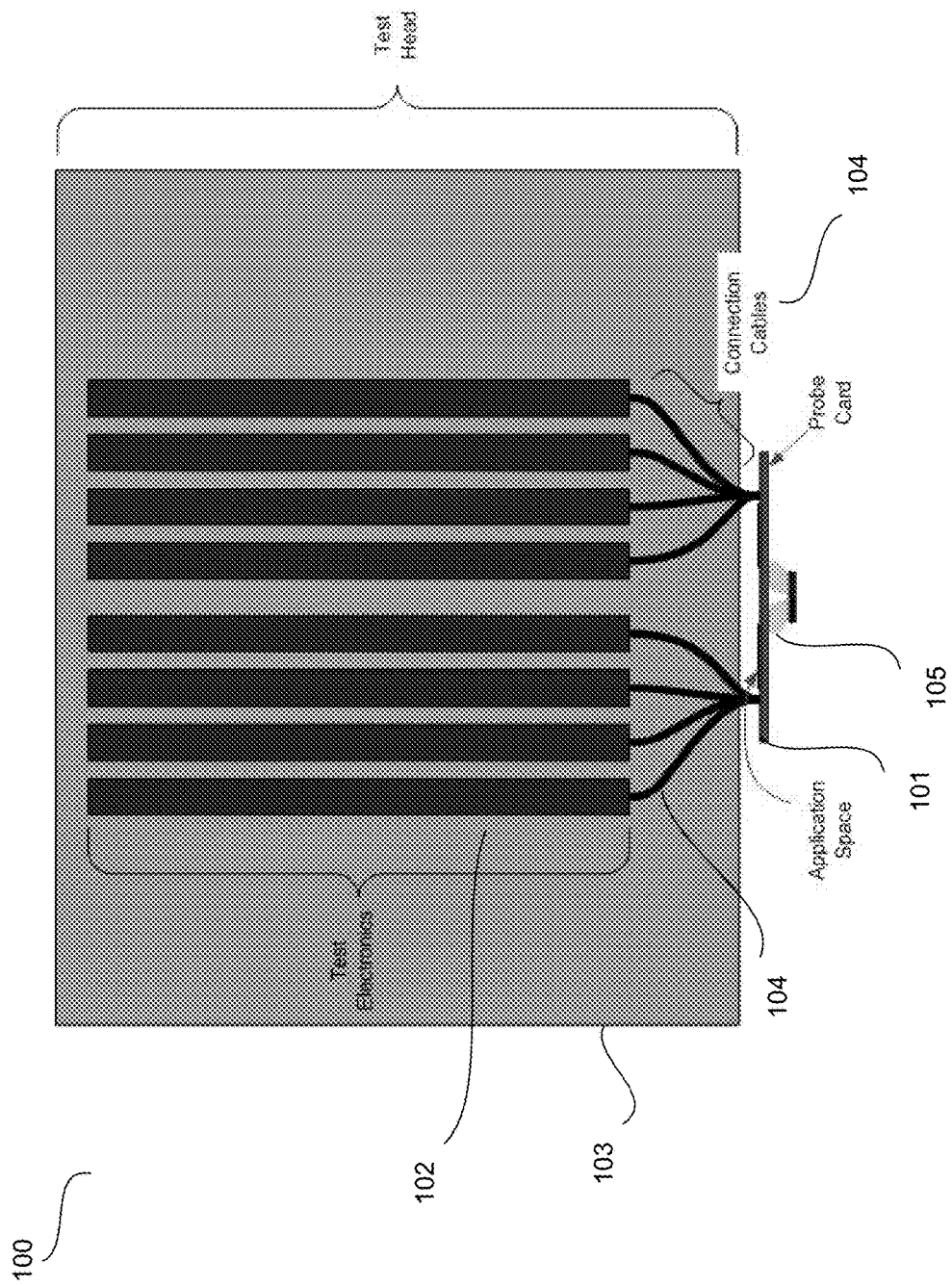
FIG. 1 shows an example implementation of a test system.

Manufacturers may test devices at various stages of manufacturing. In an example manufacturing process, integrated circuits are fabricated in large quantities on a single silicon wafer. The wafer is cut into individual integrated circuits called dice. Each die may be encapsulated in plastic or another packaging material (e.g., a chip scale package) to produce a finished product.

Manufacturers have an economic incentive to detect and discard faulty components as early as possible in the manufacturing process. Accordingly, many manufacturers test integrated circuits at the wafer level, before a wafer is cut. Defective circuits are identified and generally discarded prior to packaging, thus saving the cost of packaging defective dice. As a final check, many manufacturers test each finished product before it is shipped. Such a process tests parts in packages that have had additional expense added to them over bare dice. So, having accurate test results reduces the need to discard valuable parts.

To test quantities of devices, manufacturers commonly use ATE, e.g. Automatic Test Equipment (or "testers"). In response to instructions in a test program set (TPS), ATE automatically generates input signals to be applied to a device under test (DUT), such as a bare die or dice, and monitors resulting output signals. The ATE compares the output signals with expected responses to determine whether each DUT is defective. ATE typically includes a computer system and a test instruments or devices having corresponding functionalities.

In some implementations, ATE is used to test electronic devices, or dice, at the wafer level. The electronic devices being tested on the wafer are the DUTs, and are different from electronic devices on a printed circuit board (PCB) that are components that enable testing. In some implementations the PCB is used for radio frequency (RF) testing, and in other implementations the PCB may be used for other types of (e.g., non-RF) testing. In example implementations involving RF testing, components on the PCB for RF test are there, among other things, to provide a switching matrix between the many RF channels coming from the DUT and the lesser number of test channels available in the tester.

In example implementations that involve RF testing, also found on the PCB in the application apace are baluns, which may be used for impedance matching between the lines of the test system and the impedance lines of the DUT, and capacitors which support multiple power supplies of the DUTs by providing shorter, lower-inductance connections between stored energy in the capacitors and the DUT. This latter may be relevant in some instances because the DUT can switch power states so quickly that the power supply cannot track the desired voltage at the DUT due to the inductance of the lines connecting the power supply to the DUT. This phenomenon is a function of cable length and construction, and may be compensated for by supplemental bypass capacitors mounted as electrically close as possible to the DUT. These bypass capacitors provide a nearby (connected by a relatively low-inductance path) reserve supply of stored energy which can be called upon by the DUT when it turns on and limits over-voltage spiking when the DUT turns off. In some implementations, without the bypass capacitors both undervoltage (sag) and overvoltage (spike) conditions can occur at the DUT, creating either soft or, potentially, hard failures.

The PCB may be used in testing DUTs (e.g., dice) on the wafer en masse, e.g., in parallel (or simultaneously). In an example implementation, the PCB may be part of (or form) a test probe card (e.g., an RF test or other test probe card), which itself may be part of a device interface board (DIB) of an ATE. The probe card may be used in performing tests on the DUTs on the wafer. For example, the probe card may be brought into contact with multiple DUTs on the wafer, and tests may be performed in parallel on those DUTs. In an example, the probe card may be brought into contact with a 2×8 block of adjacent DUTs on the wafer or with any other appropriate block of DUTs. Thereafter, the probe card may be moved to a different (e.g., adjacent) block of DUTs on the wafer, and those DUTS may be tested. This process may be repeated until all DUTs on the wafer are tested. Contact between the probe card and DUTs on the wafer is described below.

FIG. 1 shows an example test system 100 that includes a PCB 101, which constitutes a probe card, and which includes components such as those described herein. As shown, signals are routed between PCB 101 and test electronics 102, which may be part of a tester test head 103. The test electronics may perform the actual testing on a DUT, e.g., by sending signals to the DUT, through cables 104, PCB 101, and interconnect 105 (examples of which are described below). Responses to those signals may retrace that path to reach the test electronics, where those responses are measured to determine whether a DUT is operating properly. In some implementations, the test electronics may have a different configuration than that shown, and may perform processing outside of the test head, e.g., at one or more processing devices, such as a computer.

In some implementations, cables 104 may be part of a coaxial structure. In this regard, cables 104 may be coaxial cables that are incorporated in the coaxial structure. For example, cables 104 may be an integral part of the coaxial structure, and may be formed inside the coaxial structure. In some implementations, a coaxial line in a coaxial structure includes, but is not limited to, a signal (or force) line surrounded completely by a dielectric, such as air, that is, in turn, surrounded completely by return (or ground) line. In some implementations of a coaxial line, the signal (or force) line may be partially surrounded by a dielectric, such as air, that is, in turn, surrounded only partially by return (or ground) line. In other words, "coaxial", as used herein, does not require that the same dielectric completely surround the force line, nor does it require that a return line completely surround the dielectric. This is the case for any coaxial line described herein.

In some implementations, the application space is the area of the test system that includes the switching matrix described herein, among other things. In this regard, the switching matrix is only an example of the type of circuitry that may be included in the application space. Accordingly, while the systems, apparatus and methods described herein are described in the context of the switching matrix, they are not limited to use with that type of circuitry, but rather may be used with any appropriate type of circuitry. Furthermore, the systems, apparatus and methods described herein are not limited to use with circuitry found in the application space of a test system, but rather may be used to implement any appropriate type of circuitry in any appropriate type of electronic or other type of system.

Figure 2:
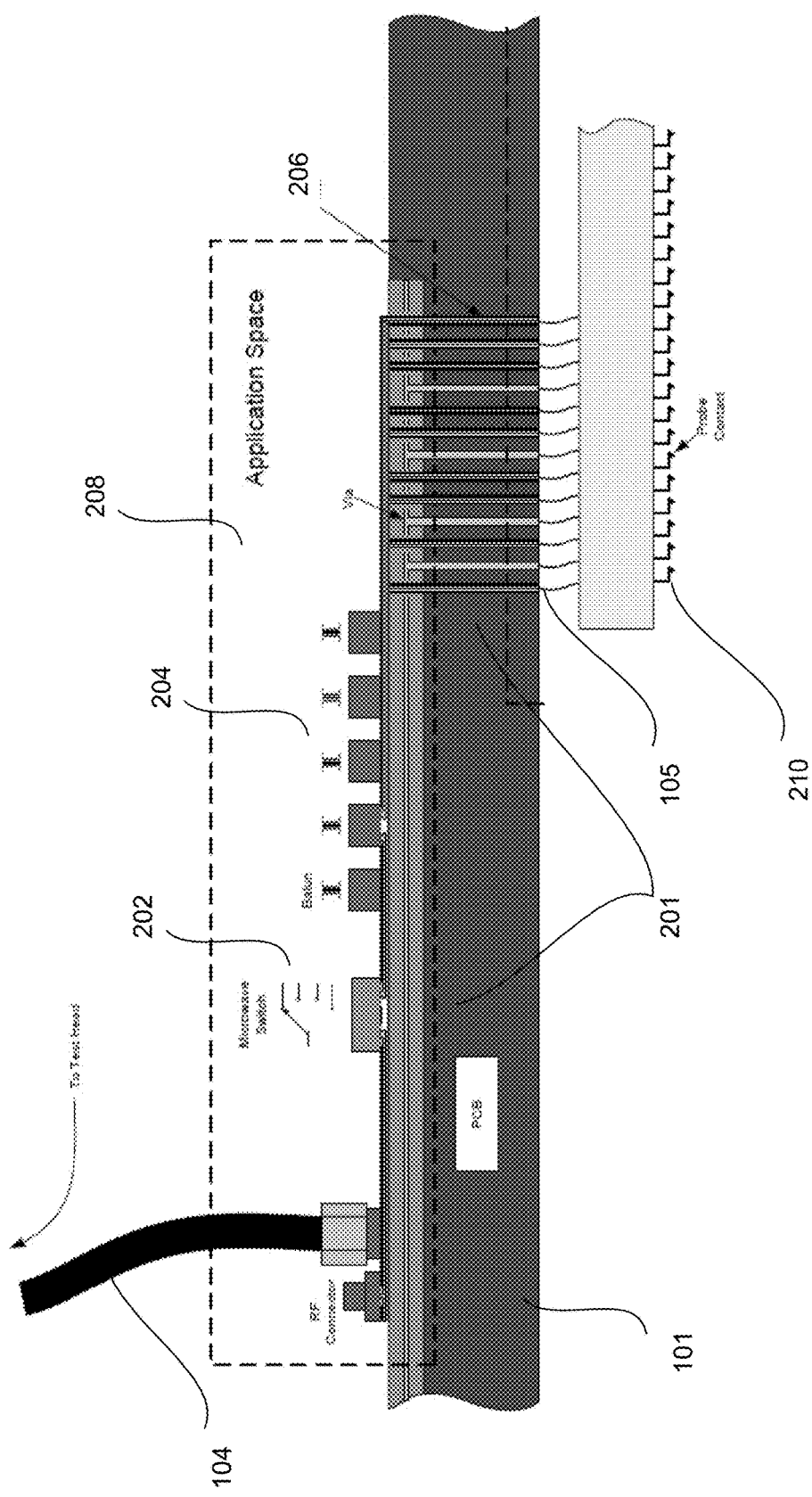
FIG. 2 shows an example implementation of a switching matrix that may be used to transmit signals through a printed circuit board.

Referring to FIG. 2, switching matrix 201 in AS (e.g. Application Space) 208 may include, but is not limited to, active and/or passive elements. For example, the switching matrix may include microwave switches 202, e.g., for routing signals and thereby selecting which functions are to be tested. Examples of other elements that may be part of the switching matrix, or otherwise included in the application space, include, but are not limited to, capacitors (not shown), baluns 204, and microwave integrated circuits (MIMICs) (not shown), which may be gallium arsenide devices that are capable of generating and receiving high-speed signals. Other types of elements that are not described here may be part of the switching matrix.

In some implementations, the switching network may be implemented using one or more coaxial structures 206. The one or more coaxial structures are referred to as the application space (AS) coaxial structure to distinguish it/them from the coaxial structure(s) between the AS 208 and the test electronics 102 and the interconnect 105 described below between the AS and the DUT. Heretofore, in some cases, elements of the AS switching matrix were incorporated into, or mounted on, PCB 101. PCB electrical conduits, in particular, did not have a coaxial structure and, therefore, could be subject to unacceptable levels of electrical signal loss and crosstalk. By using coaxial conduits, such as the coaxial vias shown in FIG. 2, electrical signal load and crosstalk may be decreased, thereby resulting in improved signal integrity during testing. Coaxial structures 206 may be formed using any process described herein or using other appropriate process(es). Coaxial structures 206 may have the form of any coaxial structure described herein or of any other appropriate coaxial structure.

In some implementations, the AS coaxial structure may be separate from the underlying PCB and directly connect to coaxial structures leading to the test head 103 and to the interconnect 105, thereby providing an end-to-end coaxial structure for the test system. In some implementations, this end-to-end coaxial structure includes coaxial signal transmission conduits from test electronics 102, through coaxial structure 104, to a point 210 at which the probe head contacts the DUTs. In some implementations, there may be no gaps in the coaxial transmission conduits. In other implementations, there may be one or more gaps in the coaxial transmission conduits (e.g., between different coaxial structures), with the gaps being breached by other types of transmission elements, such as stripline connections or other circuit elements. In some implementations, the AS coaxial structure 206 may be used separately from, and in different circuitry than, the other coaxial structures described with respect to FIGS. 1 and 2 including, but not limited to, interconnect 105.

In this example, the AS coaxial structure may include coaxial conduits for transmitting signals through PCB 101 to interconnect 105. The AS coaxial structure may also include one or more active and/or passive circuit elements, such as those described above. The AS coaxial structure may be an integrated structure. For example, it may be formed using one or more additive-manufacturing processes and/or one or more (subtractive) machining processes. For example, in some implementations, the AS coaxial structure may be formed using three-dimensional (3D) printing or two-and-a-half dimensional (2½ D) printing. Examples of 3D and 2½ D printing processes that may be used to form the AS coaxial structure are described below. However, other types of additive-manufacturing processes may be used in addition to, or instead of, those processes described below. As also noted, machining processes may be used to form the coaxial structure(s) by removing material from an existing structure to produce the AS coaxial structure.

In some implementations, in order to promote consistency in signal transmission, electrical characteristics of different conduits may substantially match. For example, the impedances of different conduits may be controlled to be substantially the same. In this context, impedance-control includes the ability to specify the impedance of individual conduits and to match the impedances of different conduits. Also, the electrical path length (as opposed to the physical path length) as measured by ToF (Time of Flight) of the different conduits may be substantially the same. And, the signal attenuation produced by different electrical conduits may be substantially the same. In some implementations, all electrical conduits in the AF coaxial structure have the same impedance, electrical path length, and attenuation. In other implementations, this is not the case, and those characteristics vary. For example, in some implementations, the test electronics may account for, and/or correct for, variations in one or more of these parameters.

The AS coaxial 206 structure may be a fully integrated structure, in which active and/or passive circuit elements such as those described above (e.g., capacitors, baluns, microwave switches, MIMICs, etc.) are formed as part of the AS coaxial structure. For example, these active and/or passive circuit elements may be constructed as part of the AS coaxial structure during formation of the structure using additive-manufacturing and/or machining processes. In some implementations, all of these active and/or passive circuit elements may be constructed as part of the AS coaxial structure during formation of the structure using additive-manufacturing and/or machining processes. In some implementations, only some of these active and/or passive circuit elements may be constructed as part of the AS coaxial structure during formation of the structure using additive-manufacturing and/or machining processes. In some implementations, these active and/or passive circuit elements may not be constructed as part of the AS coaxial structure during formation of the structure using additive-manufacturing and/or machining processes. Instead, these active and/or passive circuit elements may be formed beforehand and connected to the AS coaxial structure and appropriately connected to the coaxial signal transmission conduits to affect signal transmission as intended.

In some implementations, PCB 101 may be constructed as part of the AS coaxial structure during formation of the structure using additive-manufacturing and/or machining processes. In some implementations, PCB 101 may not be constructed as part of the AS coaxial structure during formation of the structure using additive-manufacturing and/or machining processes. Instead, PCB 101 may be formed beforehand and the AS coaxial structure appropriately connected thereto or integrated therein.

In implementations where the AS coaxial structure and the PCB are separate structures, once formed, the AS coaxial structure may be appropriately mounted on the PCB. For example, the AS coaxial structure may be mounted onto the PCB so that the appropriate electrical connections and so that one or more coaxial transmission conduits are able to connect to other coaxial or other structures so as to transmit signals via coaxial transmission conduits through the application space (including the PCB) along pathway(s) between the test electronics and the DUT.

In some implementations, the AS coaxial structure may include one or more cooling conduits formed into the structure. The cooling conduits may be connected to a coolant source, which may include liquid and/or gas. For example, water, HFE (hydrofluoroethers), or other coolant may be used. The cooling conduits may be hermetically sealed so as to prevent leakage of the coolant. The cooling conduits may be located in the AS coaxial structure only or they may extend end-to-end in the test system via other coaxial structures (including the interconnect described below) The cooling conduits may be placed within the thermal environment of circuit elements in the application space or elsewhere in the test system. For example, the test system may include sensors for detecting signals from the DUT. Cooling conduits may be positioned so as to thermally impact the sensors in order to maintain the sensors at an appropriate temperature level.

As described above, the switching matrix described herein may be used to provide system end-to-end coaxial transmission between test electronics and DUTs on a wafer or elsewhere. In this regard, electronic devices on the PCB may be arranged at a specific pitch. In some implementations, a pitch includes the distance between parts (e.g., centers) of adjacent electronic devices. In other implementations, pitch may be defined differently. The pitch on the PCB is typically, although not necessarily, greater than the pitch of corresponding DUT contacts on the wafer. For instance, in some example implementations, the pitch on the PCB is 15 mm and the pitch on the wafer is 5 mm. Notably, the systems described herein may be used with any pitch values, and there may be cases where the pitches on the PCB and the wafer are the same.

Figure 3:
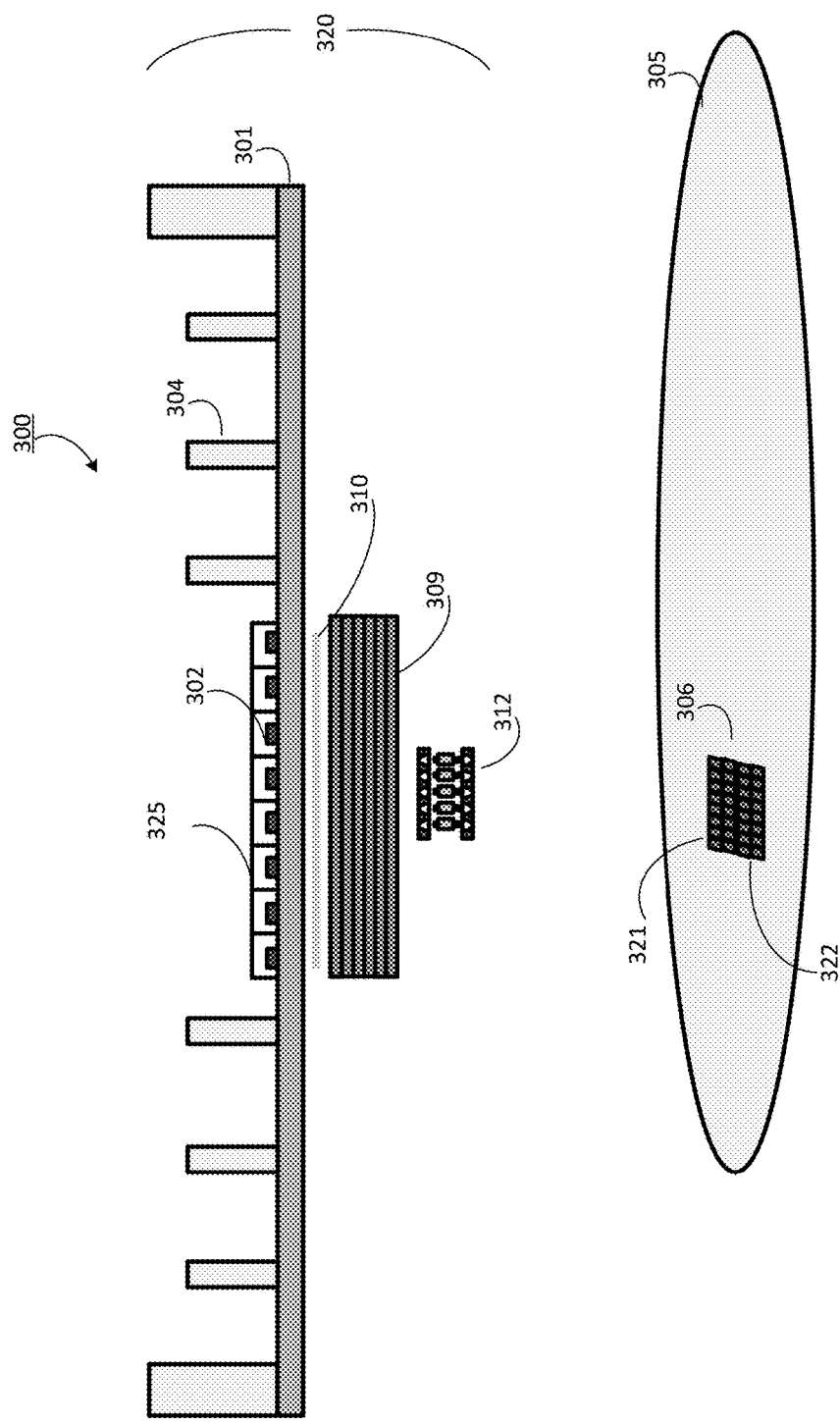
FIG. 3 is an example of a test system containing a test board and an interconnect, and a wafer containing DUTs to be tested.

FIG. 3 shows an example of a test system 300 of the type described with respect to FIGS. 1 and 2. FIG. 3 also shows a comparison between the pitch of electronic devices 302 on a PCB to corresponding contacts 306 for DUTs on a wafer 305. As shown in FIG. 3, the DUT pattern for electronic devices 302 on the probe card has a difference in pitch than the actual DUTs 321, 322 on wafer 305.

As explained above, in some implementations, the test systems described herein provide an interconnect to route signals between the AS coaxial structure 206, such as that described above, and DUT contacts on the wafer. This may be done using an interconnect that translates the pitch of the PCB to the pitch of the wafer. To this end, in an example implementation the electronic devices and associated circuitry are arranged on a PCB at a first pitch, e.g., with possibly inches between devices. The interconnect is used to translate from the first pitch space on the PCB to a pitch on a wafer (a second pitch) that is smaller than the first pitch. In some implementations, an air-dielectric coaxial line is used in the interconnect and in the AS coaxial structure. Using air as a dielectric may reduce dielectric losses while the lower dielectric constant of air may permit larger conductors and lower conductive losses for a given impedance relative to most commonly used dielectrics; however, dielectrics other than air may be used. Using a coaxial configuration also may reduce skin depth conductivity losses.

In some implementations, other dielectrics may be used in addition to, or instead of, air. Examples of such dielectrics include, but are not limited to, plastic, ceramic, and glass. In examples where air is used, additional dielectric material may be used to maintain and/or support spacing between an outer, non-air material and an interior conductive material adjacent to air. In some implementations, there may be additional dielectric material between the interior conductive material and the air. For example, from inner to outer, the sequence may proceed as: inner conductive material, dielectric, air, outer material and so forth, if applicable. Each dielectric in any implementation may be composed of multiple dielectric materials.

In some implementations, the test systems described herein make use of an additive-manufacturing process to produce a coaxial line for wafer-level testing. In an example, an additive-manufacturing process, examples of which are 2½-D and 3D printing, may be used to produce coaxial lines at a pitch that can interface between electronic devices on the test PCB and wafer-level DUT contacts. Using additively-manufactured electrical conduits that are part of an electrical pathway between electronic devices on a PCB and DUT contacts on a wafer may improve parallel testing of some electronic devices.

In this regard, in order to promote consistency in signal transmission, electrical characteristics of different conduits should substantially match. For example, the impedances of different conduits should be controlled to be substantially the same. In this context, impedance-controlled includes the ability to specify the impedance of individual conduits and to match the impedances of different conduits. Also, the electrical path length (as opposed to the physical path length) as measured by ToF (Time of Flight) of the different conduits should be substantially the same. And, the signal attenuation produced by different electrical conduits should be substantially the same. In some implementations, all electrical conduits in the interconnect have the same impedance, electrical path length, and attenuation. In other implementations, this need not be the case. For example, in some implementations, the test electronics may account for, and/or correct for, variations in one or more of these parameters.

In an example implementation, the electrical elements included on PCB 101 include electronic devices that are part of a radio frequency (RF) probe function. In other implementations, the test systems described herein may be used to provide interconnects for different types of touch-down, or other, test functions.

Referring back to FIG. 3, example test system 300 includes a PCB 301 of the type shown in FIG. 1, which includes electrical elements. In this example, the electrical elements include electronic devices 302 that are part of a probe card used to perform wafer-level tests on a DUT. However, the systems described herein are not limited to use with PCBs containing electronic devices that are part of a probe card. Rather, the electrical elements may include, e.g., anything to or from which a signal can be routed. For example, the electrical elements may include cables or other types of electrical conduits that terminate on the PCB. In this example, the PCB also includes structural stiffener 304. Also in this example, circuitry 325 is associated with each corresponding electronic device.

Electronic devices 302 are arranged at a first pitch, as shown in FIG. 3. The first pitch may be any distance between electronic devices. In the example of FIG. 3, the pitch at which electronic devices 302 are arranged is greater than the pitch of corresponding DUT contacts on wafer 305. However, as noted above, in other implementations, this may not be the case. For example, in other implementations, the pitch at which electronic devices 302 are arranged may be less than, or equal to, the pitch of corresponding DUT contacts on wafer 305. Electronic devices 302 on PCB 301 map to corresponding DUT contacts 306 on wafer 305. That is, there is an electrical pathway between appropriate signal contacts on electronic devices 302 and corresponding DUT contacts on wafer 305. Accordingly, testing of a DUT on wafer 305 may be enabled by electronic devices 302 on PCB 301 by routing signals to/from, DUTs on wafer 305 via the electrical pathway.

The electrical pathway between electronic devices 302 and contacts 306 on wafer 305 includes interconnect 309. In some implementations, interconnect 309 includes additively-manufactured electrical conduits that are impedance-controlled (e.g., manufactured or otherwise configured to attain a specified impedance or impedance range), that have a coaxial structure, and that simulate coaxial cables in terms of electrical performance. In some implementations, the additively-manufactured electrical conduits include electrically conductive material (e.g., metal, such as copper) immediately adjacent to (e.g., surrounded by or substantially surrounded by) a dielectric, such as air (e.g., an "air dielectric"). For example, from inner to outer, the sequence may proceed as: inner conductive material, air, outer material, and so forth, if applicable.

In some implementations, other dielectrics may be used in addition to, or instead of, air. Examples of such dielectrics include, but are not limited to, plastic, ceramic, and glass. In examples where air is used, additional dielectric material may be used to maintain and/or support spacing between an outer, non-air material and an interior conductive material adjacent to air. In some implementations, there may be additional dielectric material between the interior conductive material and the air. For example, from inner to outer, the sequence may proceed as: inner conductive material, dielectric, air, outer material and so forth, if applicable. Each dielectric in any implementation may be composed of multiple dielectric materials.

Figure 4:
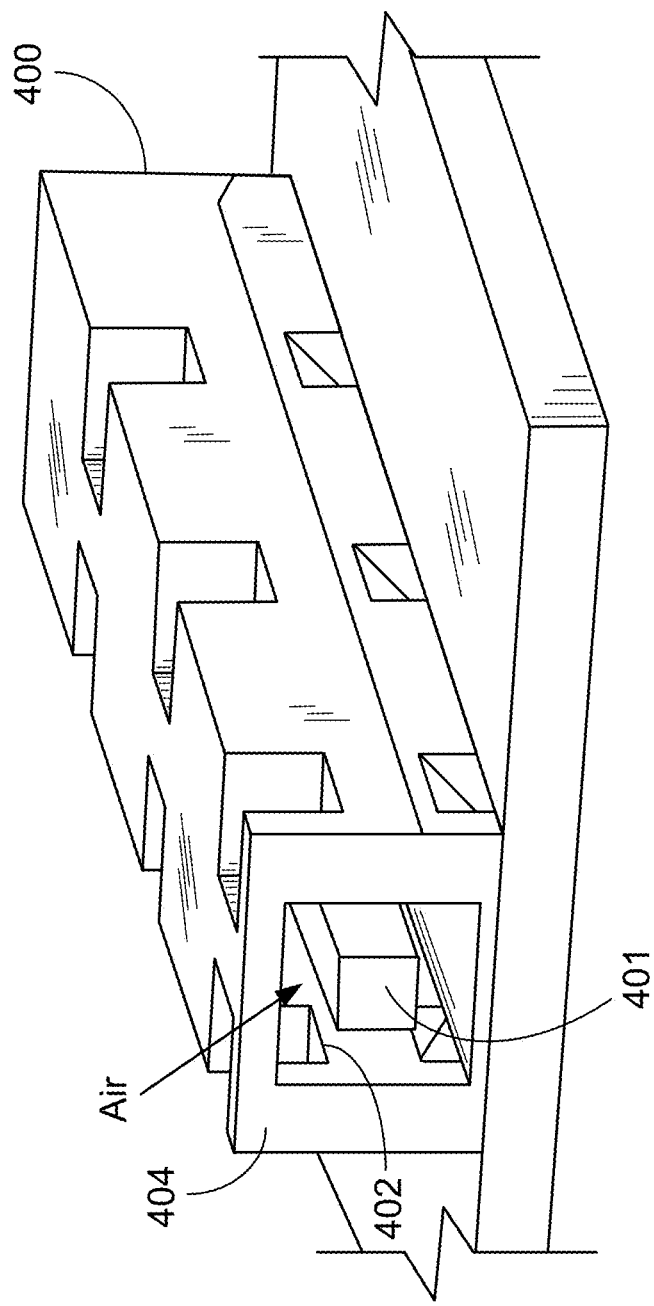
FIG. 4 is an example of an additively-manufactured electrical conduit.

FIG. 4 shows an example of an additively-manufactured electrical conduit 400, which was produced via an additive-manufacturing process such as that described below, and which may be used to implement any coaxial conduit described herein. Conduit 400 includes an inner conductive material 401, such as copper, surrounded, at least in part, by air 402. Around the air, and forming the structure of additively-manufactured electrical conduit 400, is another material 404. The other material may be metal and may act as a return path for the inner conductive material. In other implementations, the additively-manufactured electrical conduit may have a structure and/or components that are different than those shown in FIG. 4. In some implementations the additive-manufacturing process used to produce the interconnect, including the electrical conduits 3D printing. In other implementations, the additive-manufacturing process includes forming layers upon layers to produce the resulting 3D structure, examples of which include, but are not limited to, electroforming and damascene construction. Sometimes, techniques such as these are referred to as 2½-D printing. In some definitions, a printing process becomes 2½ D when multiple layers of the printed product are stacked and that create interconnections between the layers. In other definitions, a process that produces even a single printed layer constitutes a 2½ D printing process because that single layer necessarily has thickness.

Figure 5:
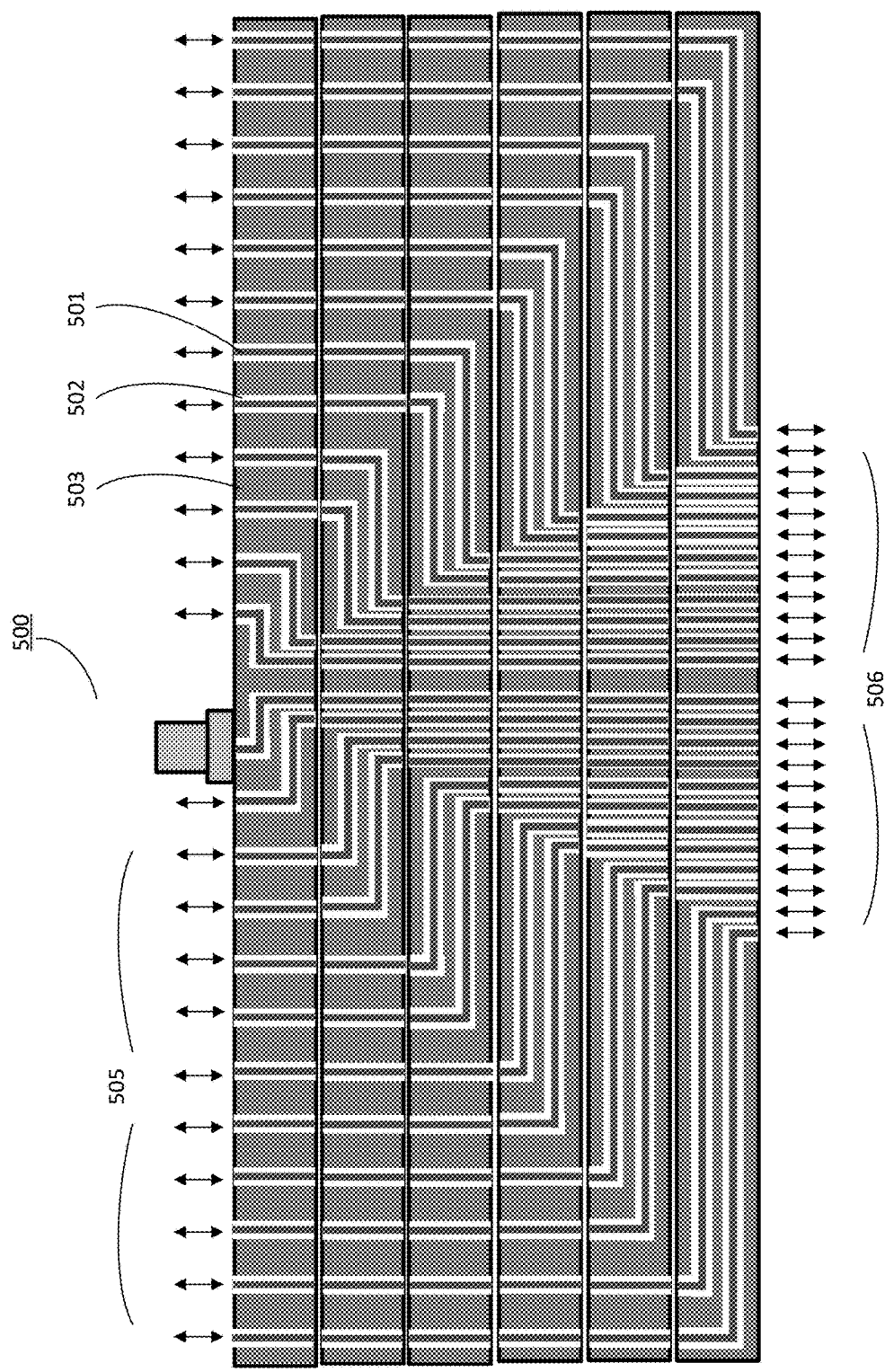
FIG. 5 is an example of an additively-manufactured interconnect.

FIG. 5 shows an example of an interconnect 500 comprised of additively-manufactured electrical conduits 501, such as that shown in FIG. 4, that are impedance-controlled and that are part of an electrical pathway between electronic devices on the PCB and DUT contacts on a wafer. In this example, an additively-manufactured electrical conduit 501 comprises electrically-conductive material adjacent to an air dielectric 502 and surrounded by another material 503. As noted above, however, in some implementations, a dielectric other than air, or in addition to air, may be used. Example interconnect 500 translates electrical connection at a first pitch 505 of the PCB to a tighter (e.g., smaller), second pitch 506 of the wafer. Here, the first pitch corresponds to the separation of, and thus the electrical connections of, electronic devices on the PCB, and the second pitch correspond to the separation of DUT contacts on the wafer.

In the example of FIG. 5 the relative thickness of the inner conductive material remains about the same throughout the interconnect, as does the size of the air dielectric. The amount of additional material, however, varies between the point closest to the PCB and the point closest to the wafer. The additive-manufacturing process enables creation of such tight pitches near to the wafer. Throughout the structure of the interconnect, in some implementations, the physical relationship between the outer walls of the conduit and the central conductor are designed and created to form a fixed tuned relationship between the two, which may be measured by impedance, as in, for example, a 50Ω transmission conduit.

Figure 6:
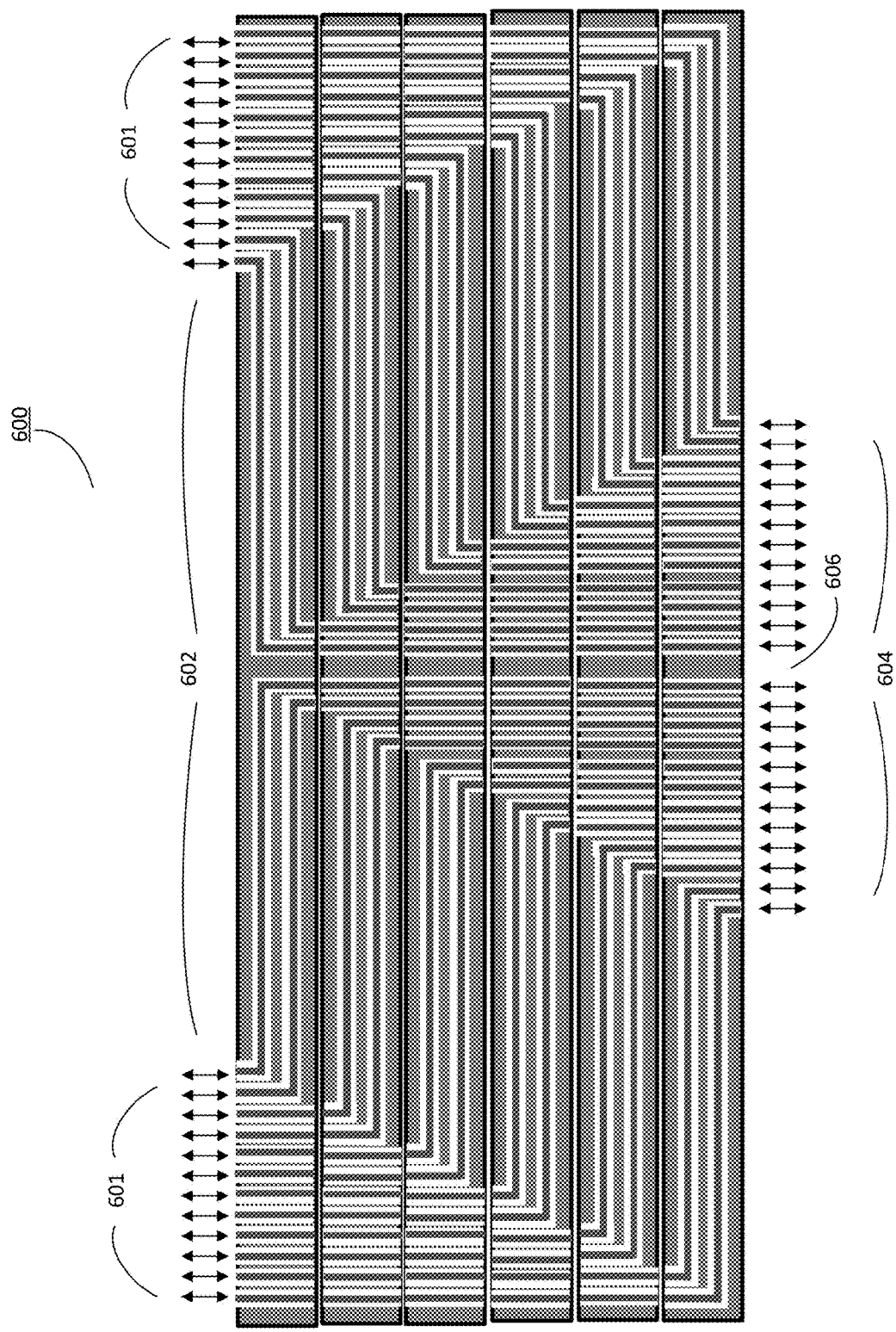
FIG. 6 is another example of an additively-manufactured interconnect.

FIG. 6 shows another example of an interconnect 600 of the type described herein, which comprises additively-manufactured electrical conduits that are impedance-controlled and that are part of an electrical pathway between electronic devices on the PCB and DUT contacts on a wafer. In the example of FIG. 6, interconnect 600 translates a pitch between groups 601 of electronic devices, which are separated by space 602, into a tighter pitch 604, in which DUT contacts for corresponding groups on the wafer are separated by a smaller space 606.

In some implementations, like that shown in FIG. 3, the electrical pathway between electronic devices on the PCB and contacts on the wafer includes structures in addition to interconnect 309. For example, such structures may include an interposer material 310 that electrically and physically connects PCB 301 and interconnect 309. The structures may also include a contactor assembly 312. Contactor assembly 312 may electrically and physically connect interconnect 309 and contacts 306 on wafer 305. In some implementations, contactor assembly 312 may include one or more pins (e.g., spring-based POGO® pins) that electrically and physically connect electrical conduits in the interconnect to corresponding contacts on the wafer. In other implementations, contactor assembly 312 may include one or more MEMS (Micro Electro-Mechanical Systems) devices that make the appropriate electrical and physical connection between electrical conduits in the interconnect and corresponding contacts on the wafer. In some implementations, fewer or more structures than are shown in FIG. 3 may be included.

In some implementations, the electrical pathway between electronic devices on the PCB and contacts on the wafer includes an interconnect only. In such implementations, structures and/or functions of interposer material 310, contactor assembly 312, and any other appropriate intermediary structures may be constructed as part of the interconnect during the additive-manufacturing process that forms the interconnect. In some example implementations, these structures may be formed inside of, or incorporated into, the interconnect via processes other than additive-manufacturing.

Examples of additive-manufacturing process that may be used in the systems described herein include, but are not limited to, the MICA Freeform™ process developed by Microfabrica, Inc. of Van Nuys, Calif. and the Polystrata™ process developed by Nuvotronics, LLC of Durham, N.C.

Figure 7:
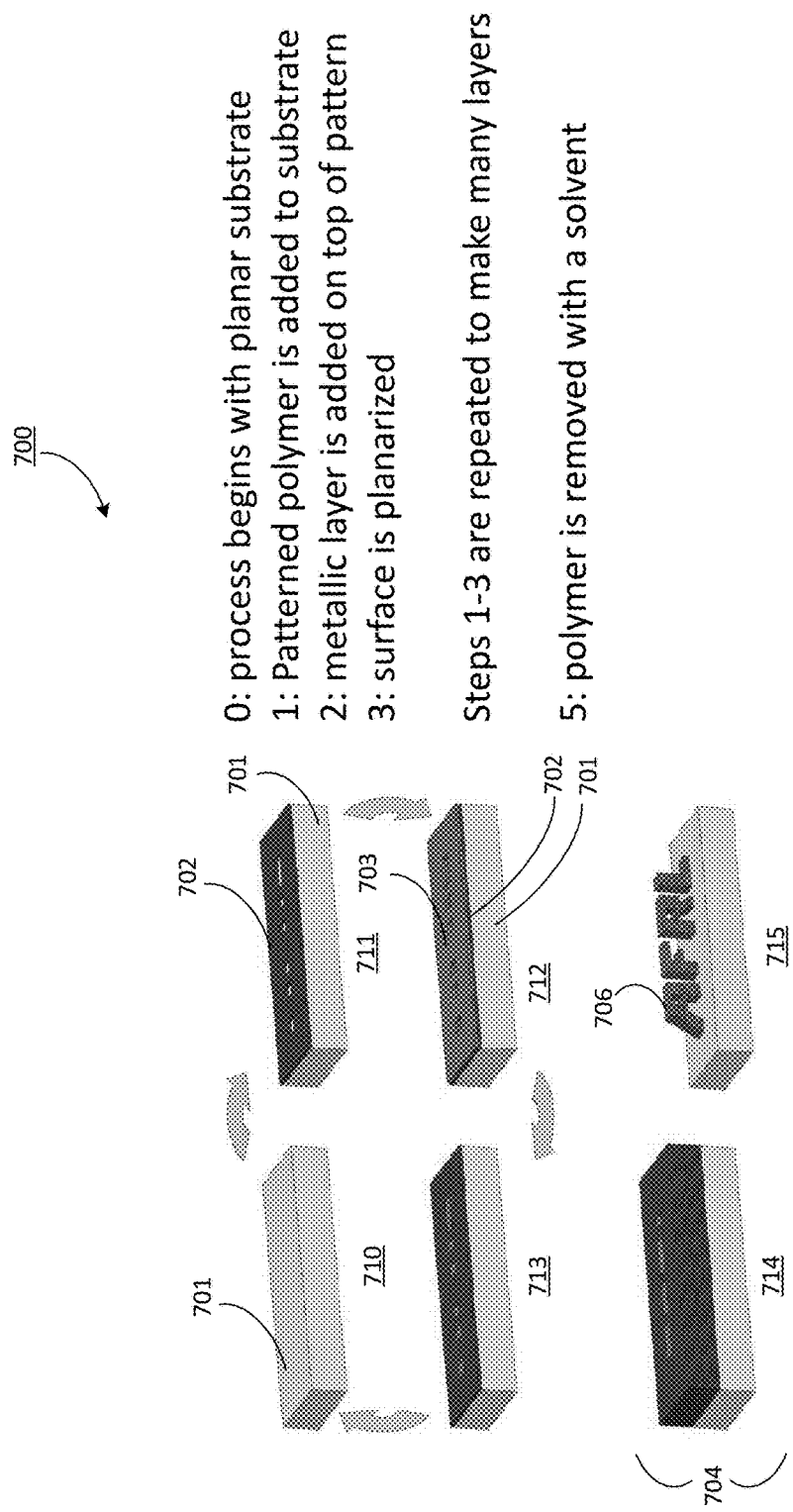
FIG. 7 is an example of an additive-manufacturing process.

FIG. 7 shows an example of an additive-manufacturing process 700 that includes operations that may be used in a process for creating coaxial structures of the type described herein (which includes additively-manufactured electrical conduits that comprise electrically-conductive material adjacent to a dielectric, such as air). The additive-manufacturing process of FIG. 7 may also be used to implement any of the coaxial structures described herein. Example process 700 begins (710) with a planar substrate 701. A patterned polymer 702 is added (711) to planar substrate 701. A metallic layer 703 is added (712) on top of patterned polymer 702, which fills-in the pattern of the patterned polymer. The surface is then planarized (713) to remove the excess metal. Operations 710 to 713 are repeated (714) any appropriate number of times to create a layer stack 704 comprised of polymer with embedded metal. Once the appropriate number of layers are in the stack, the polymer is removed (715) using a solvent, thereby leaving the exposed metal 706. This basic process comprised of operations 710 to 715, however, is typically augmented to support the center of a coaxial line (e.g., a conductive material surrounded by an air dielectric).

Figure 8:
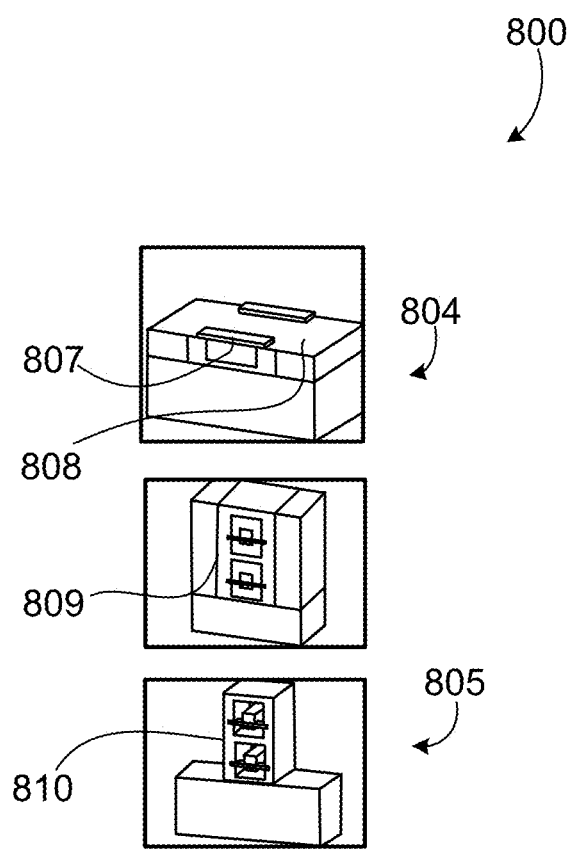
FIG. 8 is an example of part an additive-manufacturing process that may be used to produce an additively-manufactured interconnect having a coaxial structure.

For example, FIG. 8 shows an example of a process 800 that includes operations similar to those of process 700, and which may be used to generate an electrical conduit comprised of a conductive material surrounded by a dielectric, such as air. The additive-manufacturing process of FIG. 8 may also be used to implement any of the coaxial structures described herein. According to process 800, a strata is formed by addition of layers until it is completed. The strata may be formed according to operations 710 to 714 above, e.g., through lithography, electroplating, and planarization to produce a structure comprised of patterned polymer with embedded metal layer(s). At one more points during construction of a strata, dielectric straps 807 may be embedded (804) in the metal layers to support the inner conductive material 808. Multiple strata 809 may be built by performing successive operations including lithography, electroplating, and planarization. Thereafter, the polymer (or whatever resist is used) may be dissolved (805) to leave the resulting electrical conduit 810.

In other implementations, additive-manufacturing processes other than those described herein may be used to create the interconnect. For example, true 3D printing may be used to create the interconnect.

Referring back to FIG. 3, as part of a testing process, the structure 320 comprised of PCB 301, interposer material 310, interconnect 309, and contactor assembly 312 may be brought into contact (e.g., electrical connection) with contacts for a block of DUTs 321. These DUTs may be tested in parallel, e.g., simultaneously. Thereafter, the structure 320 may be brought into contact with another block 322 of DUTs on wafer 305, and those DUTs may be tested in parallel. This process may be repeated until all DUTs on the wafer are tested. The testing process may be computer controlled. For example, movement across a wafer may be computer-controlled, the application and analysis of test signals may be computer-controlled, and so forth.

Figure 9:
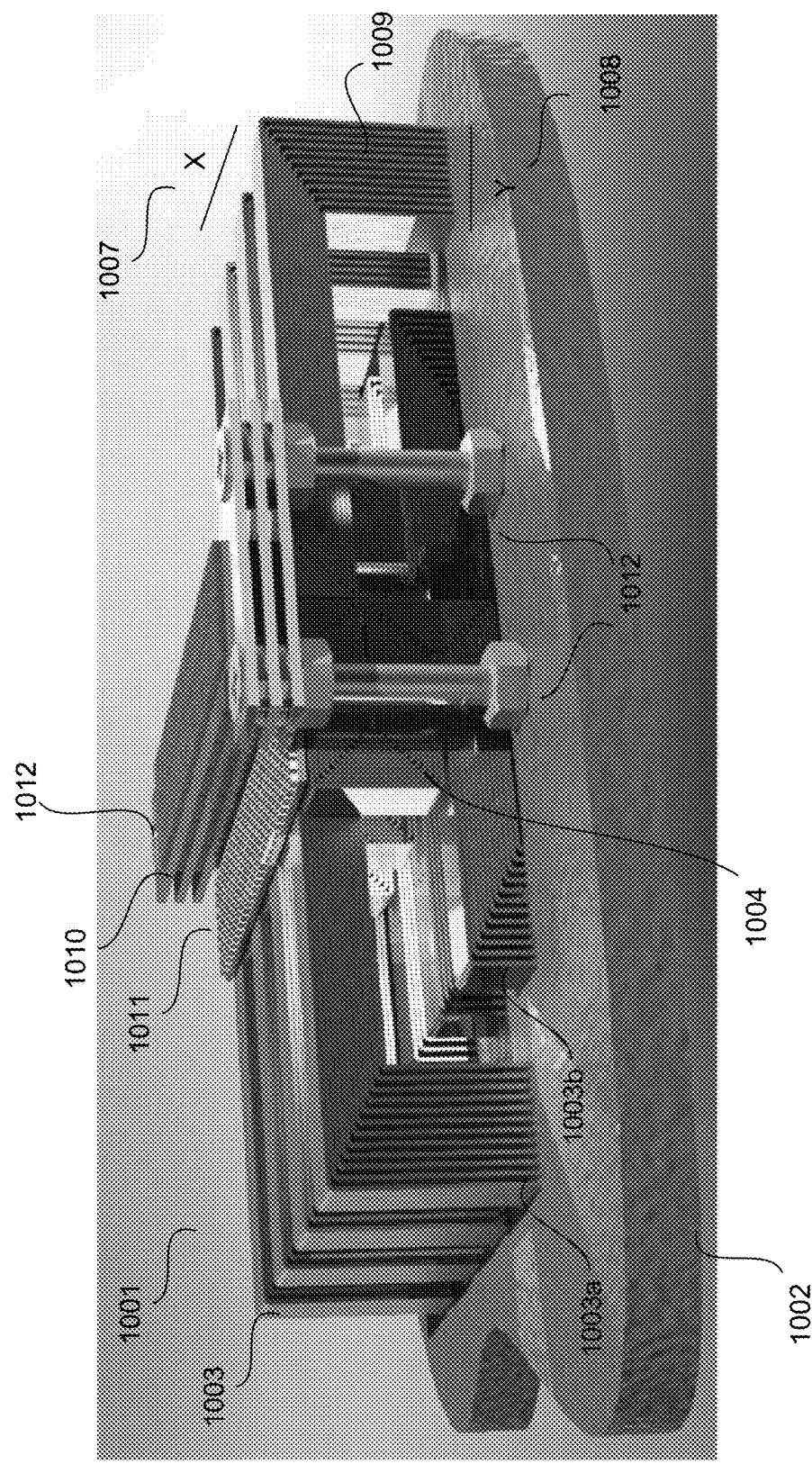
FIG. 9 is an alternative example implementation of an interconnect.

FIG. 9 shows another example implementation of an additively-manufactured electrical interconnect 1001, and associated structures, to route signals between test circuitry electronic devices (not shown) on a PCB 1002 and DUT contacts on a wafer (not shown). In the example implementation of FIG. 9, the additively-manufactured electrical interconnect includes individual additively-manufactured electrical conduits 1003. The individual additively-manufactured electrical conduits 1003 may be of the type described herein, e.g., they may be miniature coaxial structures, with each conduit comprising an electrically-conductive core (center), surrounded by a dielectric material, such as air, ceramic, glass, plastic, or the like. The electrically-conductive core is, in turn, surrounded by an electrically-conductive outer material that functions as an electrical return for the core. The electrically-conductive outer material may, in turn, be surrounded by an insulator or isolated from other conductors by air, or may be electrically connected to the other outer material.

In the example interconnect 1001, at least some of (e.g., all of) the additively-manufactured electrical conduits are configured to have substantially matching electrical characteristics, such as electrical path lengths/Time of Flight (ToF), impedance, and signal attenuation. By substantially matching these electrical characteristics, it is possible to reduce the chances that there will be differences in signal transmission time between conduits, and thereby reduce timing errors resulting from transmission through the interconnect. In this context, a substantial match may include a match that is identical or to within one or more predefined tolerances. In some implementations, it may only be appropriate to substantially match only one or two of electrical path length, impedance, and signal attenuation.

In this implementation, matching electrical characteristics are achieved, at least in part, by using curved or serpentine conduit portions. For example, as shown in FIG. 9, individual conduits include curved or serpentine portions 1004. These portions are configured so that the electrical path lengths, impedances, and signal attenuation is the same among different conduits. In the example implementation of FIG. 9, conduits 1003*a* routes signals to points further from their origin than conduits 1003*b*. Without the curved or serpentine portions 1004, this difference could result in conduits 1003*a* having different electrical characteristics than conduits 1003*b*. As a result, signals passing through conduits 1003*a* signals passing through different conduits would have different electrical characteristics (e.g., timing, attenuation, etc.) than signals passing through conduits 1003*b*. However, the addition of curved or serpentine portions 1004 effectively elongates the signal transmission path of conduits 1003b, thereby causing electrical characteristics of different conduits, such as electrical path lengths, impedances, and signal attenuation, to match, and thereby decreasing the possibility of different effects on different signals transmitted through different conduits of the interconnect. Serpentine or curved portions may be added to any appropriate part or parts of a conduit to achieve desired electrical characteristics.

In the example implementation of FIG. 9, the pitch of the contacts on the wafer is maintained in one dimension (e.g., X-dimension 1007), but not in the other dimension (e.g., Y-dimension 1008). In other words, the spacing between conduits is spread out in Y-dimension 1008 relative to the contacts on the wafer. In the X-direction 1007, the spacing between conduits is about the same as the spacing between contacts on the wafer. In this example, for a group of conduits 1009, there are twelve conduits in X-direction 1007 and twelve conduits in Y-direction 1008. This may, or may not, be the case for each group of conduits shown in FIG. 9. This type of spacing can be advantageous. For example, it may be possible to add additional groups of conduits at the front or the back of the interconnect to accommodate larger numbers of wafer contacts.

Interconnect 1001 may also include a structure 1010, such as a circuit board, containing pins (e.g., spring contact pins, such as POGO® pins), which provide electrical connection to corresponding contacts on a DUT (the wafer). Electrical pathways pass through structure 1010 to reach circuit board 1011 (e.g., an interposer board). Circuit board 1011 includes active and/or passive electronic components that are used to compensate for inductance in the electrical transmission paths between the wafer and the circuit board 1002. In some implementations, the passive electronic components may be capacitors, baluns, or switches; however, other active and/or passive electronic components may be used.

The electrical pathways extend through circuit board 1011 to the additively-manufactured electrical conduits 1003. From there, the electrical pathways extend to electrical elements on circuit board 1002, as described above.

In the above example, three screws 1012 (see also FIG. 10) are used as a mechanism to adjust the angle of structure 1010 so that plane (at which the pins contact the DUT) is substantially parallel to circuit board 1002. For example, one or more of screws 1012 may be tightened or loosened in order to adjust the plane. In other implementations, different mechanisms may be used to make mechanical adjustments to keep the pins and the circuit board parallel.

Serpentine pathways and the various other constructs shown in FIG. 9 may be used to implement AS coaxial structure 206 or, more generally, switching matrix 201. For example, switching matrix 201 may also include curved or serpentine portions that effectively elongates the signal transmission path of its conduits, thereby causing electrical characteristics of different conduits, such as electrical path lengths, impedances, and signal attenuation, to match, and thereby decreasing the possibility of different effects on different signals transmitted through different conduits of the interconnect. Serpentine or curved portions may be added to any appropriate part or parts of a conduit to achieve desired electrical characteristics.

Figure 10:
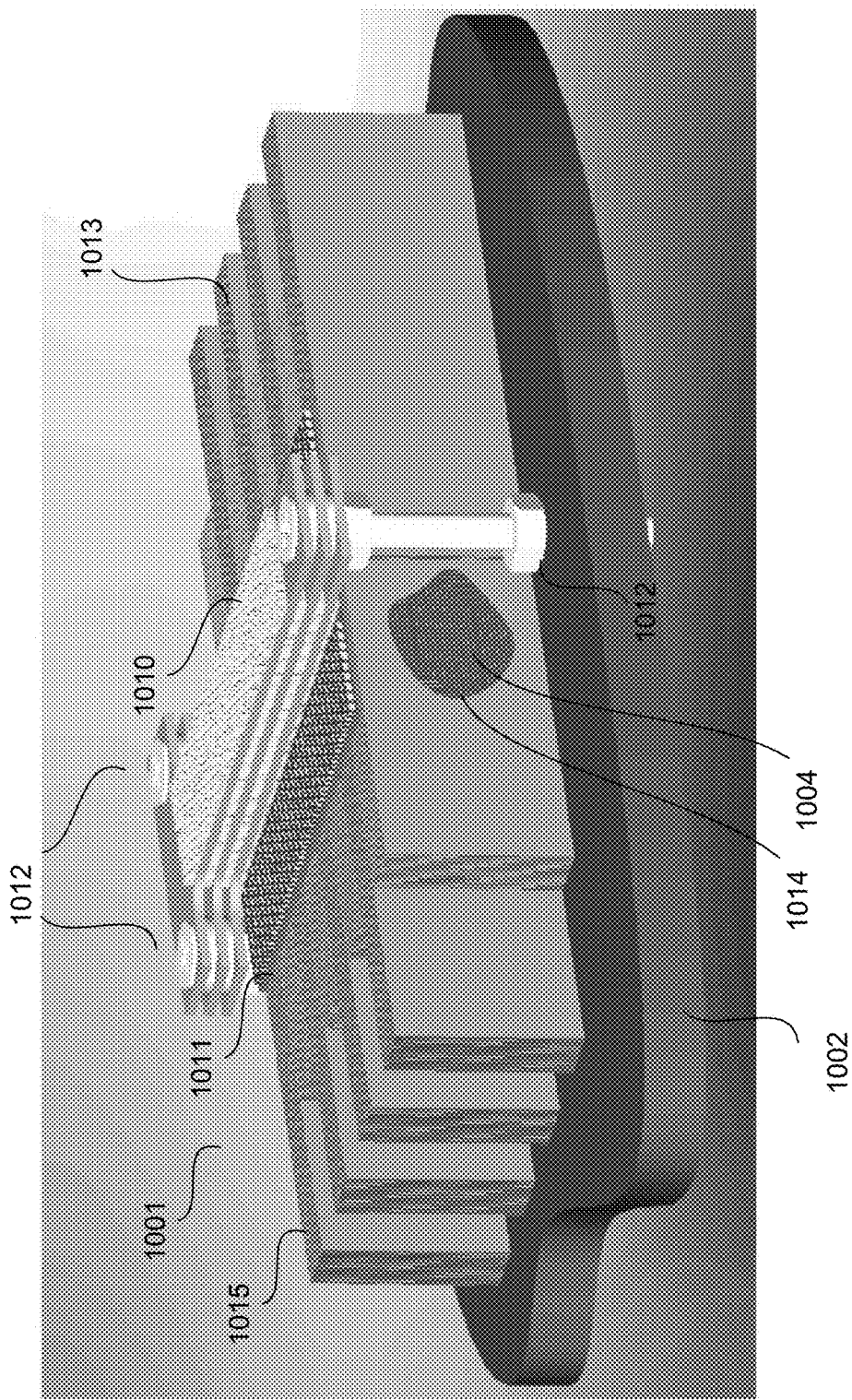
FIG. 10 is an alternative example implementation of an interconnect.

FIG. 10 shows an example of an alternative implementation that uses microstrip construction, stripline construction or a co-planar waveguide construction to produce electrical conduits 1015 for transmitting signals through the interconnect. Each of these constructions is produced using etching and, therefore, is subtractively-manufactured (e.g., machined) in the sense that material is removed from the device to produce appropriate electrical and mechanical connections. A microstrip construction, stripline construction or a co-planar waveguide construction may also be used to produce coaxial structures 206 for transmitting signals through the switching matrix (and thus the PCB) to and from the interconnect.

In this regard, to create an impedance-controlled channel two things are required: a force (often called the "signal") line and a return (often called "ground") line. A complete circuit is required to create a channel. The combination of the force and return (signal and ground) describes the complete circuit. The geometric relationship between the force and return creates the impedance.

Referring to FIG. 12A, in a stripline configuration, the impedance controlled signal line 1301 (the line that carries the signal forward, towards the DUT) is layered between two return (ground) planes 1302 (these are actually the "returns", in that the signal must have both a force and a return to create a complete circuit). The geometric relationship between those force and return lines is a factor in determining the impedance of the circuit. Resin and fabric 1303 may be between the conductive paths. Referring to FIG. 12B, a microstrip configuration removes one of the ground planes, leaving the signal line 1304 and ground plane 1305. An advantage of a microstrip is that, if a true air environment can be enforced around the signal line, the electromagnetic losses as the signal passes down the trace will be less. Referring to FIG. 12C, a coplanar waveguide is a form of microstrip where the ground plane 1307 is coplanar with the signal line 1308. The impedance is largely derived from the relationship of the traces on the surface of the structure. Coplanar waveguides are a good choice when signals are adjacent to each other that might be subject to crosstalk or inductive coupling between the traces. Any of the coaxial structures described herein may be implemented using the structures shown in FIG. 12A, FIG. 12B, and/or FIG. 12C.

Figure 11:
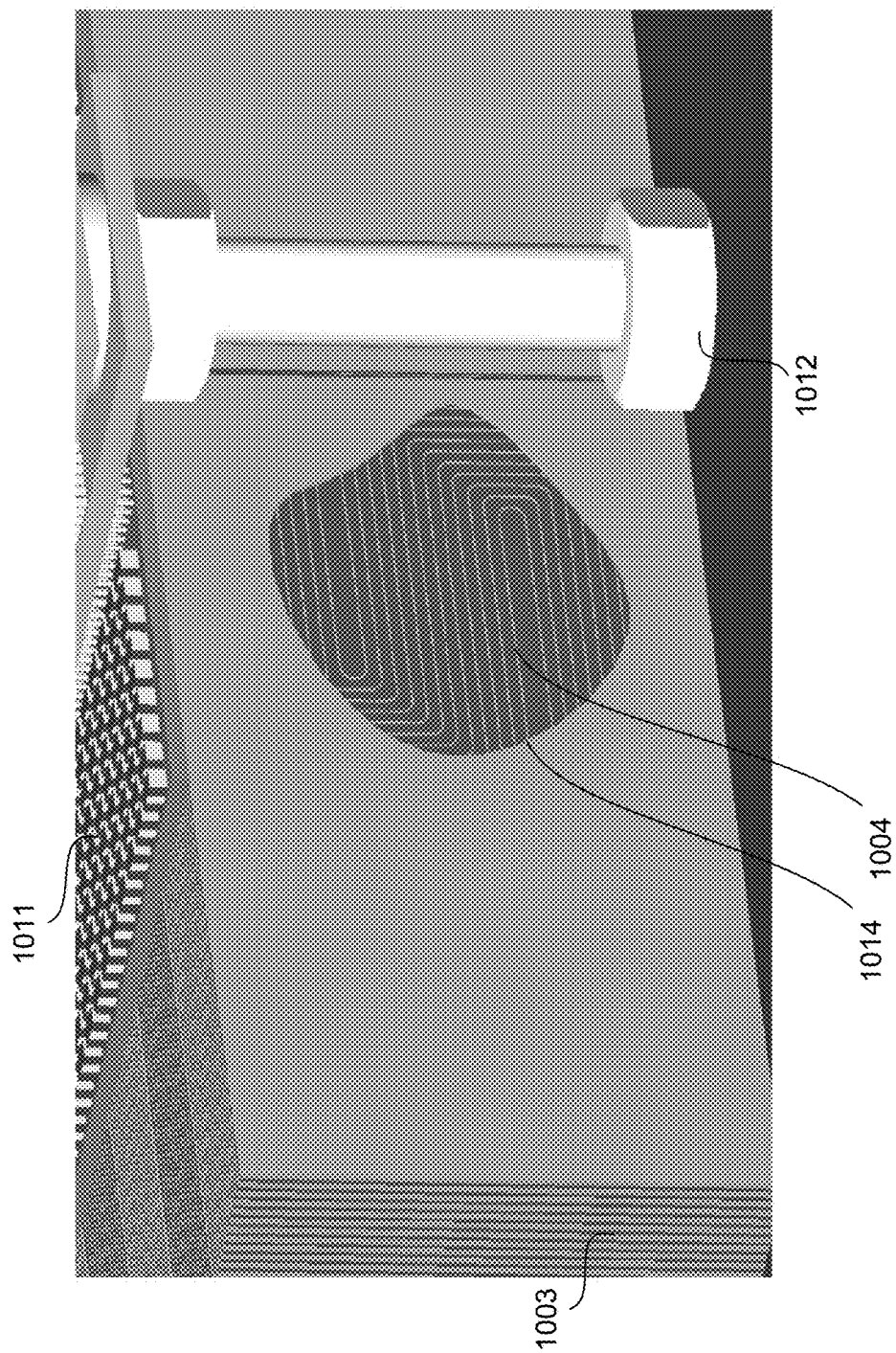
FIG. 11 is a close-up, cut away view of the example interconnect of FIG. 10.
Figure 2:
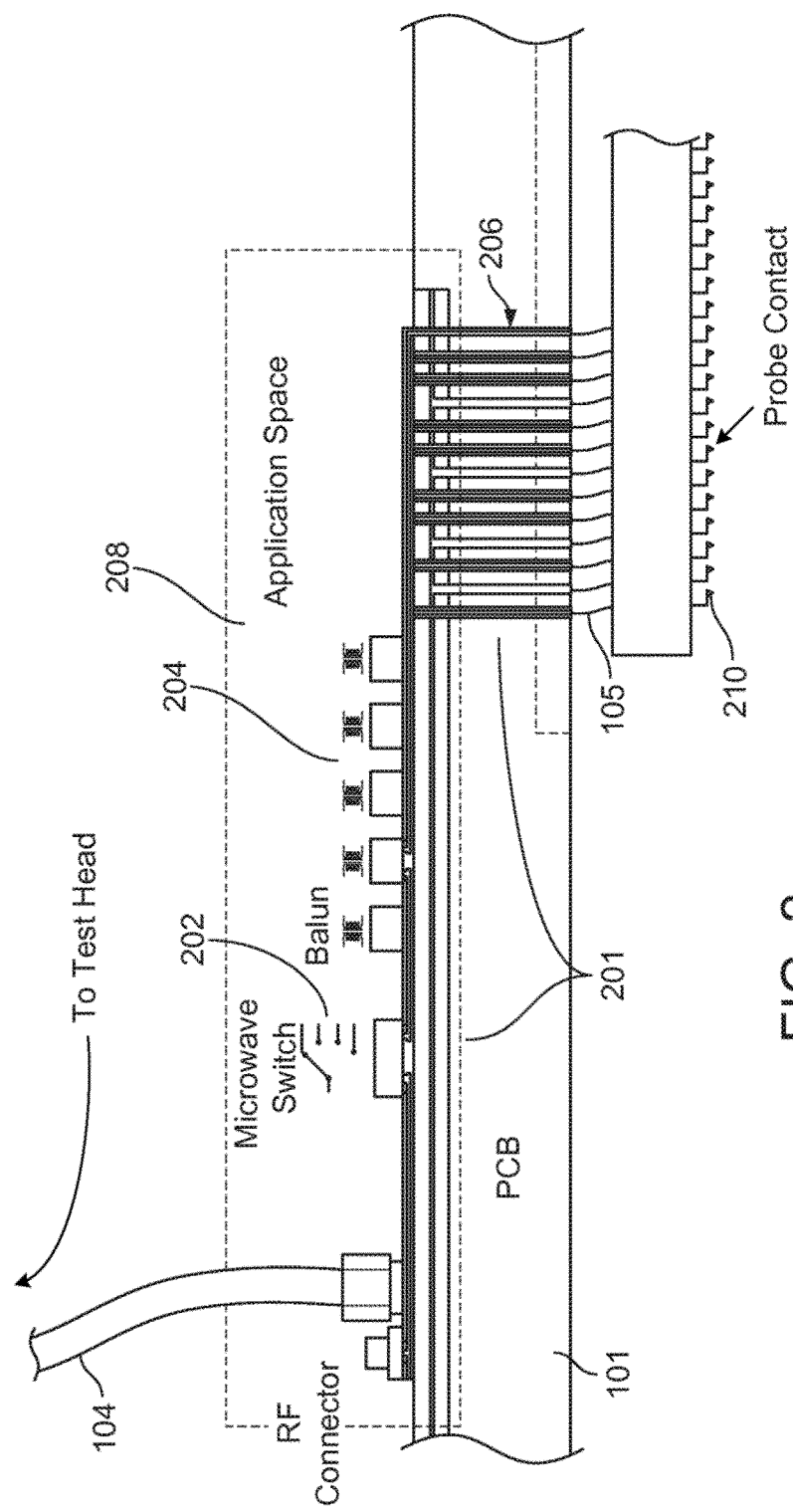
Figure 4:
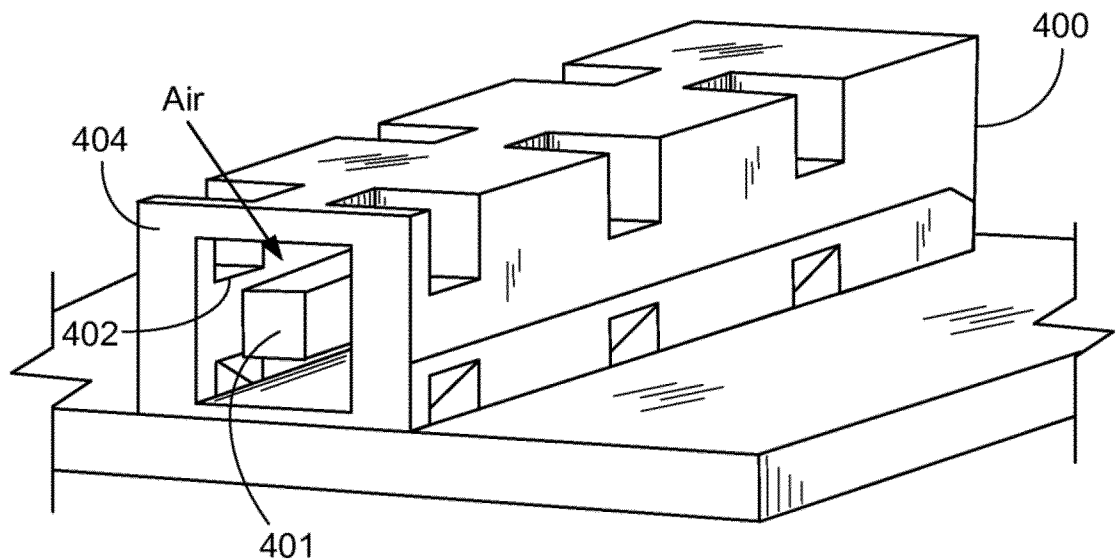
Figure 5:
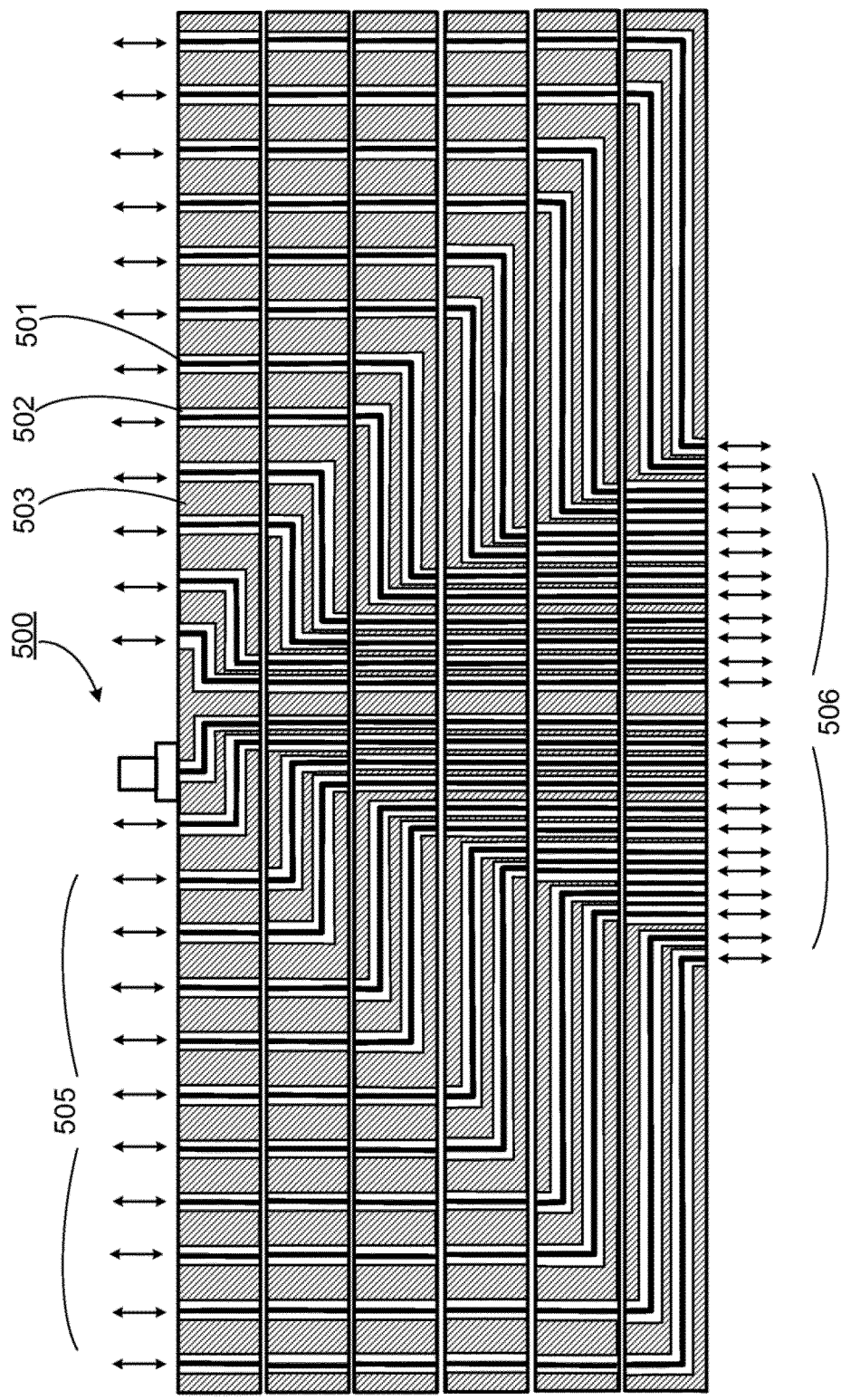
Figure 6:
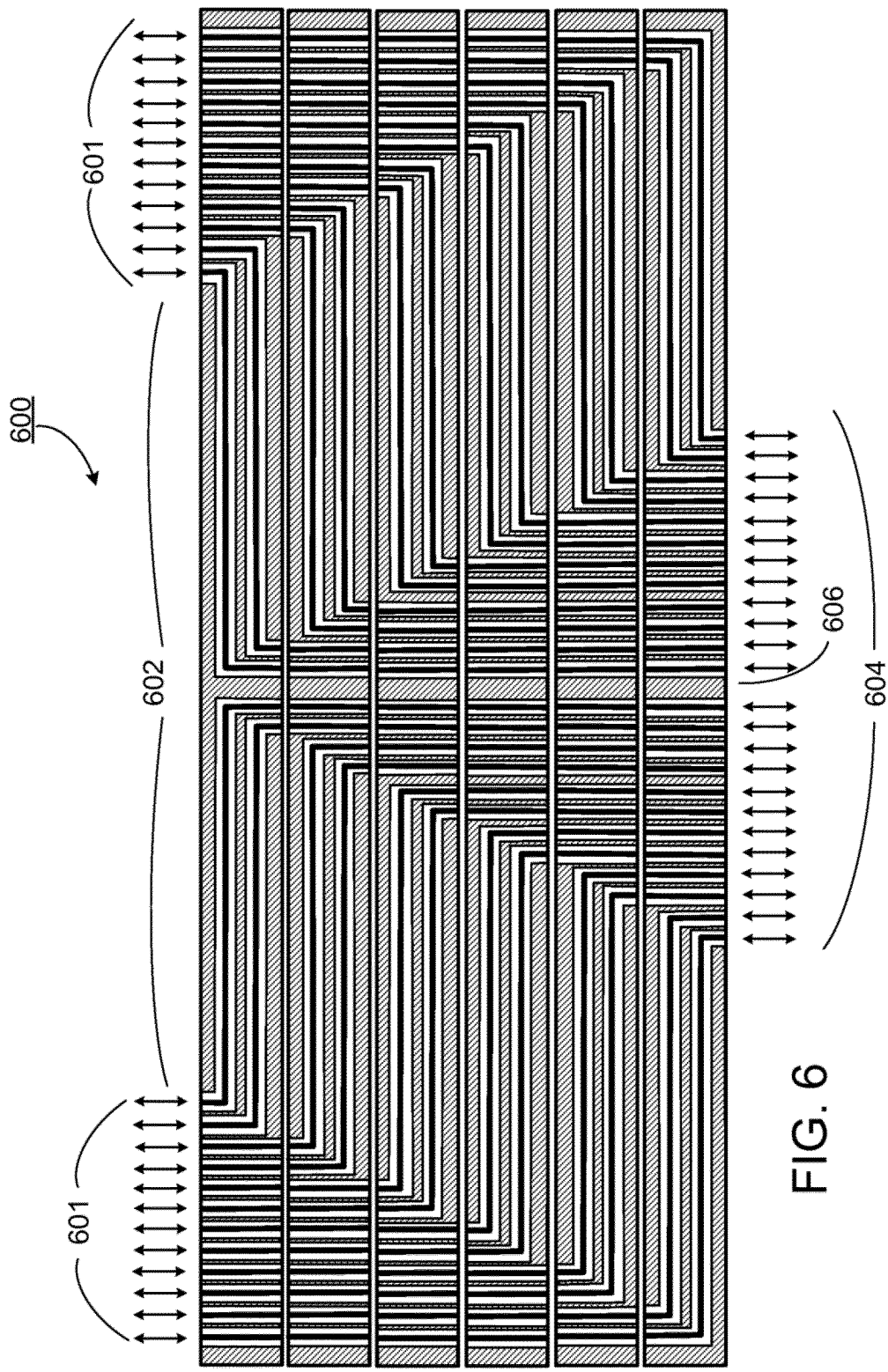
Figure 7:
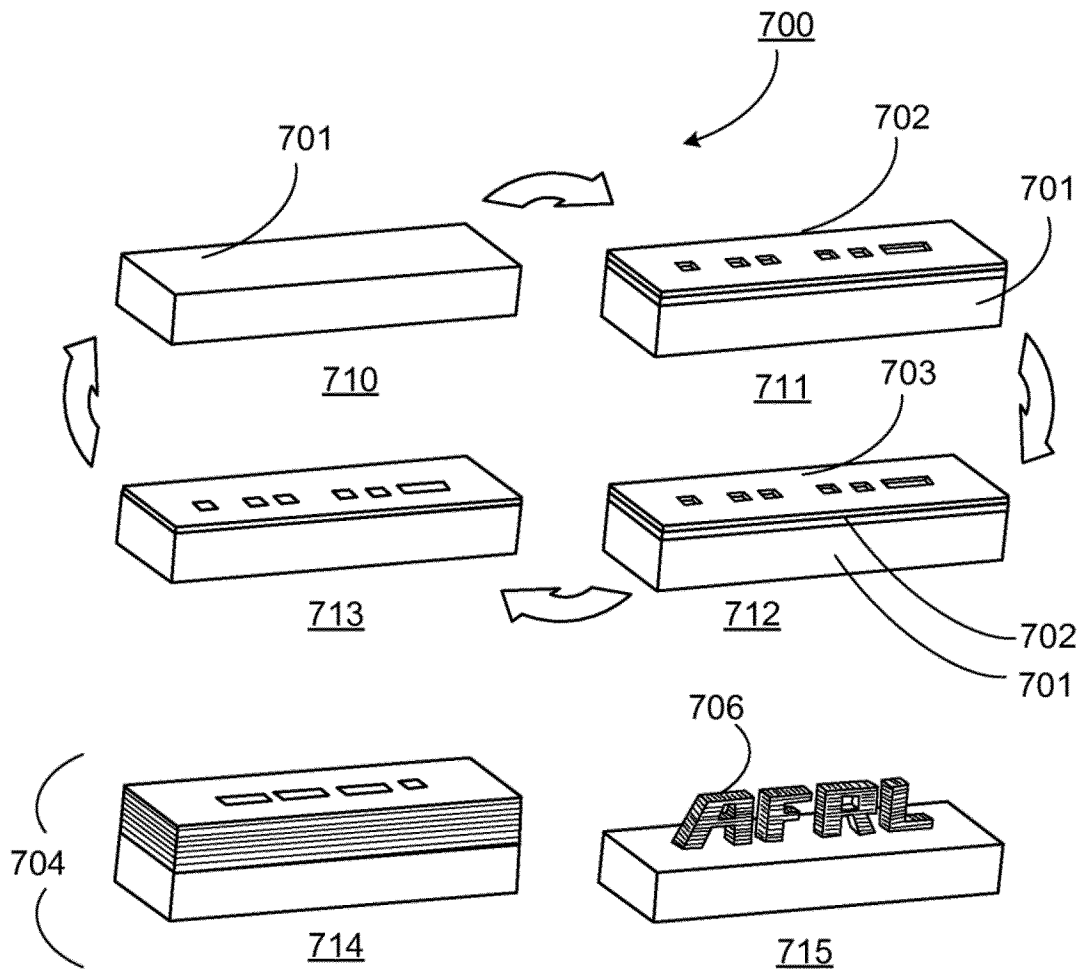
Figure 8:
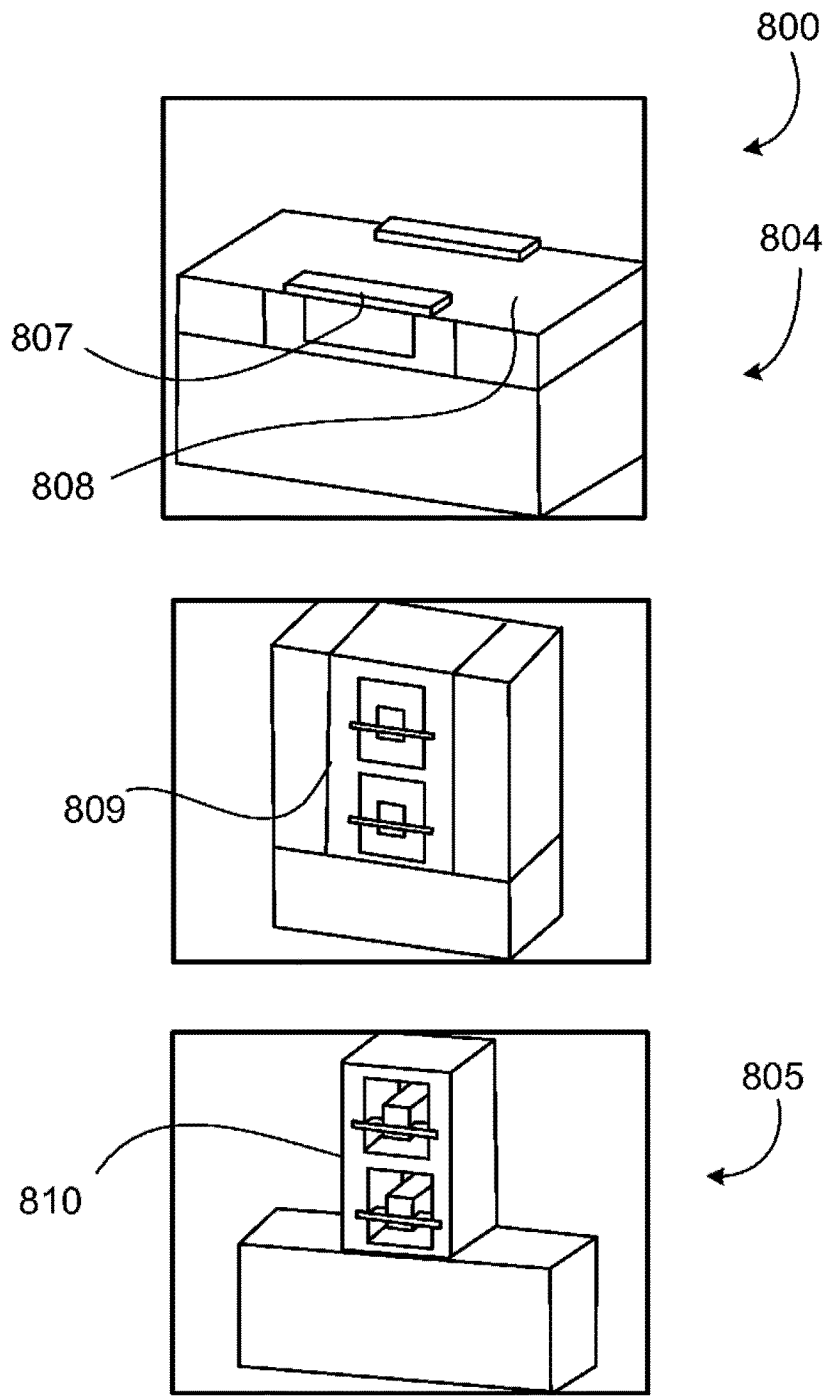
Figure 9:
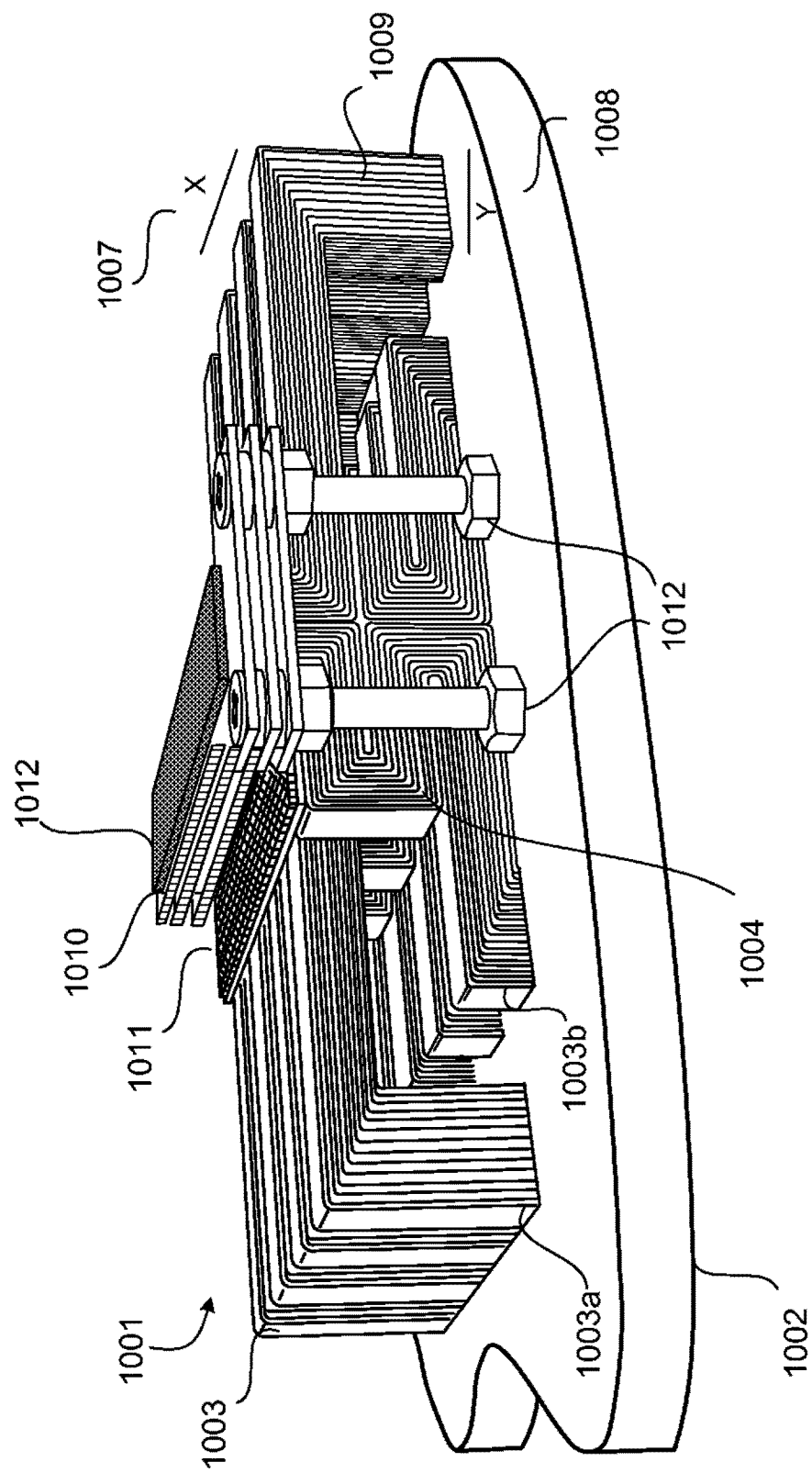
Figure 10:
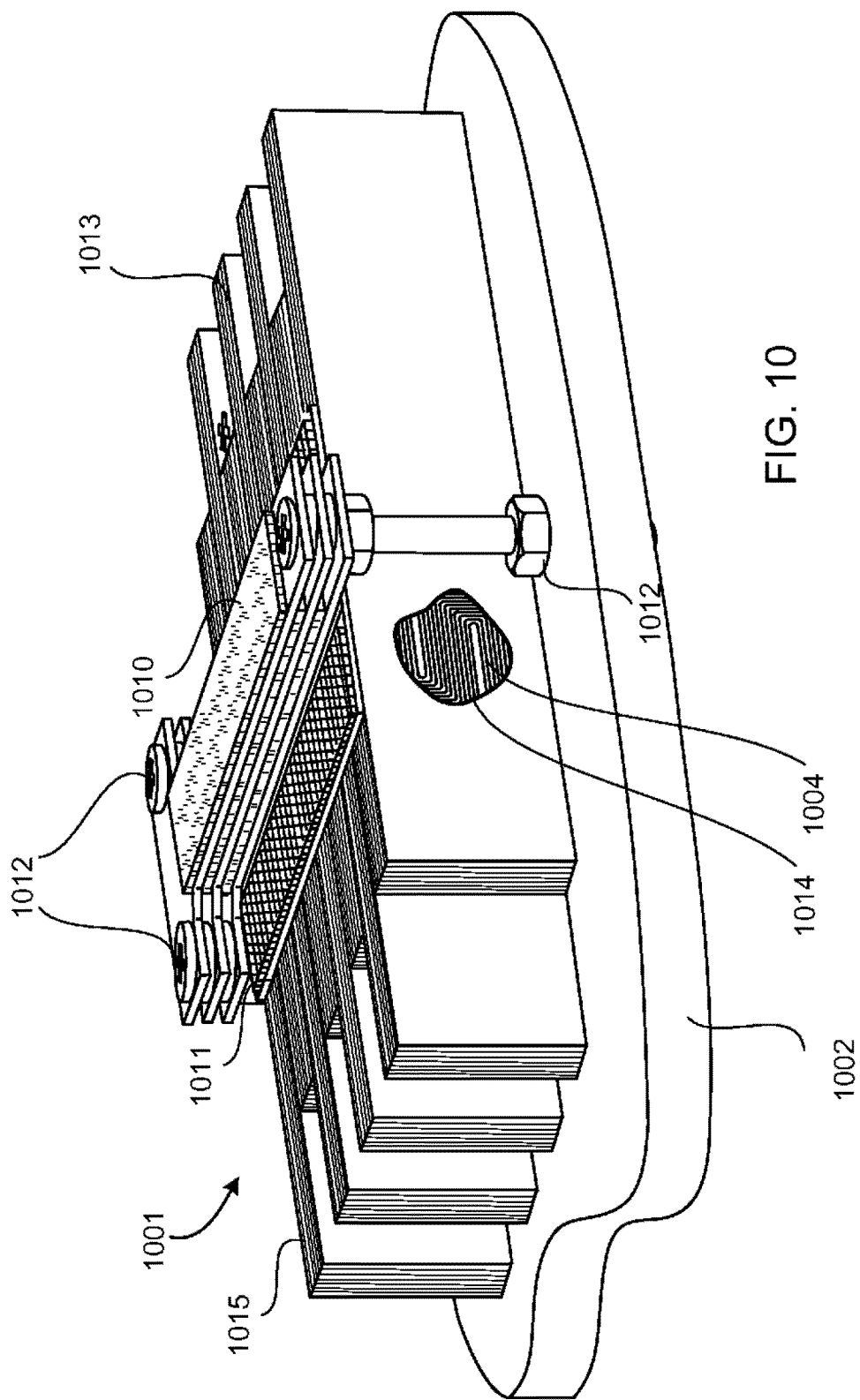

Referring back to FIG. 10, each conduit in the interconnect or the switching matrix may have a stripline configuration, a microstrip configuration or a coplanar waveguide configuration. Otherwise, the functions and features of the conduits are substantially the same as the additively-manufactured conduits described above. In FIG. 10, different groups of conduits 1013 are covered with insulating material. A portion 1014 of the insulating material is removed to reveal the serpentine portions 1004 of conduits creating the electrical pathway between the wafer and the probe card. This is shown in close-up in FIG. 11.

Any of the features described herein may be combined with any appropriate features found in U.S. patent application Ser. No. 14/084,414, the contents of which are incorporated herein by reference. For example, the structures described herein may include a circuit board comprising electrical elements arranged at a first pitch; a wafer comprising contacts arranged at a second pitch, the second pitch being less than the first pitch; and an interconnect comprising additively-manufactured electrical conduits that are part of an electrical pathway between the electrical elements and the contacts, where the additively-manufactured electrical conduits comprise electrically-conductive material.

Testing, as described herein, may be performed using a combination of system processing devices, embedded processing devices, and/or programmable logic. For example, each of these different elements may run on or more test programs to test multiple devices in parallel or in sequence. The testing described herein is not limited to RF testing, but rather may be used to test any electronic devices, including microprocessors, programmable logic, and the like While this specification describes example implementations related to "testing" and a "test system," the devices and method described herein may be used in any appropriate system, and are not limited to test systems or to the example test systems described herein.

Testing performed as described herein may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. An apparatus comprising:
a circuit board that is part of an application space between test electronics and a device under test (DUT); and
a coaxial structure to pass signals along electrical pathways between the test electronics and the DUT, the coaxial structure comprising conduits, the conduits comprising a signal line at least partially surrounded by a return line, the coaxial structure comprising multiple stacked layers of conductive material, at least some of the conduits being curved or serpentine conduits configured so that, for the at least some of the conduits, one or more of the following substantially match: electrical path length, impedance, or signal attenuation.

2. The apparatus of claim 1, wherein, in the coaxial structure, the signal line is completely surrounded by the return line.

3. The apparatus of claim 1, wherein, in the coaxial structure, the signal line is partially, but not completely, surrounded by the return line.

4. The apparatus of claim 1, wherein the coaxial structure passes through the circuit board.

5. The apparatus of claim 1, wherein the multiple stacked layers of conductive material are stacked vertically.

6. The apparatus of claim 1, wherein the coaxial structure comprises a manufactured structure.

7. The apparatus of claim 1, wherein the DUT comprises transceivers, each of the transceivers comprising devices for transmitting and receiving signals; and
wherein the coaxial structure comprises a switching matrix for selecting transceiver channels for test.

8. The apparatus of claim 1, wherein the coaxial structure comprises at least one of active elements or passive elements.

9. The apparatus of claim 8, wherein the active elements or passive elements are an integral part of the coaxial structure.

10. The apparatus of claim 8, wherein the active elements or passive elements comprise discrete components attached to integral parts of the coaxial structure.

11. The apparatus of claim 1, wherein the coaxial structure comprises at least one channel for holding or transferring thermal transmitting material, the at least one channel being positioned to thermally impact an active or passive device associated with the application space.

12. The apparatus of claim 10, where the thermal transmitting material is configured to stabilize a temperature of an active or passive device within the application space, wherein stabilizing comprises cooling or heating the device to maintain a target temperature.

13. A system comprising:
devices under test (DUTs);
test electronics to test the DUTs; and
a coaxial structure to pass signals between the test electronics and the DUTs, the coaxial structure comprising conduits comprised of signal lines at least partially surrounded by respective return lines, the coaxial structure comprising curved or serpentine conduits configured so that, for at least some of the conduits, one or more of the following substantially match: electrical path length, impedance, or signal attenuation.

14. The system of claim 13, wherein the coaxial structure is a first coaxial structure; and wherein the system further comprises:
   a second coaxial structure to pass signals between the test electronics and the first coaxial structure; and
   a third coaxial structure to pass signals between the first coaxial structure and the DUTs.

15. The system of claim 14, wherein the circuit board comprises electrical elements arranged at a first pitch;
   wherein the DUTs are on a wafer comprising contacts arranged at a second pitch, the second pitch being less than the first pitch; and
   wherein the third coaxial structure comprises an interconnect comprising additively-manufactured electrical conduits that are part of an electrical pathway between the electrical elements and the contacts, the additively-manufactured electrical conduits comprising electrically-conductive material.

16. The system of claim 13, wherein the at least some of the conduits are configured to have substantially matching electrical path lengths, impedance, and signal attenuation.

17. The system of claim 13, wherein all of the conduits are configured to have substantially matching electrical path lengths, impedance, and signal attenuation.

18. The system of claim 13, wherein, in the coaxial structure, a signal line is completely surrounded by a return line.

19. The system of claim 13, wherein, in the coaxial structure, a signal line is not completely surrounded by a return line.

20. The system of claim 13, wherein the coaxial structure comprises multiple layers of stacked conductive material.

21. The system of claim 20, wherein the multiple layers of stacked conductive material are stacked vertically.

22. The system of claim 13, wherein the coaxial structure comprises a machined structure.

23. The system of claim 13, wherein the DUT comprises transceivers, each of the transceivers comprising devices for transmitting and receiving signals; and
   wherein the coaxial structure comprises a switching matrix for selected ones of the transceivers for test.

24. The system of claim 13, wherein the coaxial structure comprises at least one of active elements or passive elements.

25. The system of claim 24, wherein the active elements or passive elements are an integral part of the coaxial structure.

26. The system of claim 24, wherein the active elements or passive elements comprise discrete components attached to integral parts of the coaxial structure.

27. The system of claim 13, wherein the coaxial structure comprises at least one channel for holding cooling liquid, the at least one channel being positioned to thermally impact an active or passive element associated with testing of a DUT.

* * * * *

UNITED STATES PATENT AND TRADEMARK OFFICE
CERTIFICATE OF CORRECTION

PATENT NO. : 9,594,114 B2
APPLICATION NO. : 14/316164
DATED : March 14, 2017
INVENTOR(S) : Roger Allen Sinsheimer Page 1 of 14

It is certified that error appears in the above-identified patent and that said Letters Patent is hereby corrected as shown below:

On the Title Page

Delete the title page and substitute therefore with the attached title page consisting of the corrected illustrative figure.

In the Drawings

Please replace FIGS. 1-12C with FIGS. 1-12C as shown on the attached pages.

Signed and Sealed this
Twenty-first Day of August, 2018

Andrei Iancu
*Director of the United States Patent and Trademark Office*

(12) United States Patent
Sinsheimer

(10) Patent No.: US 9,594,114 B2
(45) Date of Patent: Mar. 14, 2017

(54) STRUCTURE FOR TRANSMITTING SIGNALS IN AN APPLICATION SPACE BETWEEN A DEVICE UNDER TEST AND TEST ELECTRONICS

(71) Applicant: Teradyne, Inc., North Reading, MA (US)

(72) Inventor: Roger Allen Sinsheimer, Camarillo, CA (US)

(73) Assignee: Teradyne, Inc., North Reading, MA (US)

(*) Notice: Subject to any disclaimer, the term of this patent is extended or adjusted under 35 U.S.C. 154(b) by 305 days.

(21) Appl. No.: 14/316,164

(22) Filed: Jun. 26, 2014

(65) Prior Publication Data
US 2015/0377946 A1  Dec. 31, 2015

(51) Int. Cl.
G01R 31/01 (2006.01)
G01R 31/28 (2006.01)
G01R 31/319 (2006.01)

(52) U.S. Cl.
CPC ... *G01R 31/2889* (2013.01); *G01R 31/31905* (2013.01); *G01R 31/31926* (2013.01)

(58) Field of Classification Search
CPC ...... G01R 1/073; G01R 1/07364; G01R 3/00; G01R 31/01; G01R 31/2874; G01R 31/2601
USPC .......................... 324/756.03, 755.02
See application file for complete search history.

(56) References Cited

U.S. PATENT DOCUMENTS

| | | | |
|---|---|---|---|
| 3,516,077 A | 6/1970 | Bobeck et al. |
| 3,577,131 A | 5/1971 | Morrow et al. |
| 3,673,433 A | 6/1972 | Kupfer |
| 3,934,236 A | 1/1976 | Aiken et al. |
| 4,021,790 A | 5/1977 | Aiken et al. |
| 4,117,543 A | 9/1978 | Minnick et al. |
| 4,692,839 A | 9/1987 | Lee et al. |
| 4,729,166 A | 3/1988 | Lee et al. |
| 4,754,546 A | 7/1988 | Lee et al. |
| 4,757,256 A | 7/1988 | Whann et al. |
| 4,758,785 A | 7/1988 | Rath |
| 4,778,950 A | 10/1988 | Lee et al. |

(Continued)

FOREIGN PATENT DOCUMENTS

| | | |
|---|---|---|
| EP | 0298219 | 1/1989 |
| EP | 0361779 | 4/1990 |

(Continued)

OTHER PUBLICATIONS

PCT International Search Report and Written Opinion for PCT/US2015/036213 mailed Sep. 25, 2015 (9 pp).

(Continued)

*Primary Examiner* — Tung X Nguyen
*Assistant Examiner* — Robert P Alejnikov, Jr.
(74) *Attorney, Agent, or Firm* — Choate, Hall & Stewart LLP; Paul Pysher

(57) ABSTRACT

An example structure for transmitting signals in an application space between a device under test (DUT) and test electronics includes: a circuit board that is part of an application space between test electronics and a device under test (DUT); and a coaxial structure to pass signals along electrical pathways between the test electronics and the DUT. The coaxial structure includes a signal line at least partially surrounded by a return line.

27 Claims, 12 Drawing Sheets

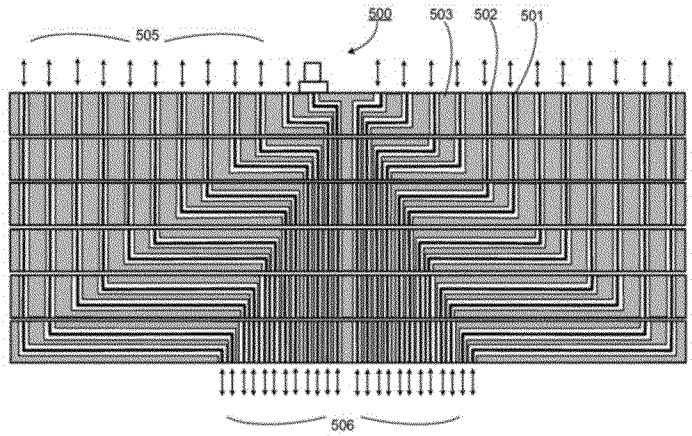

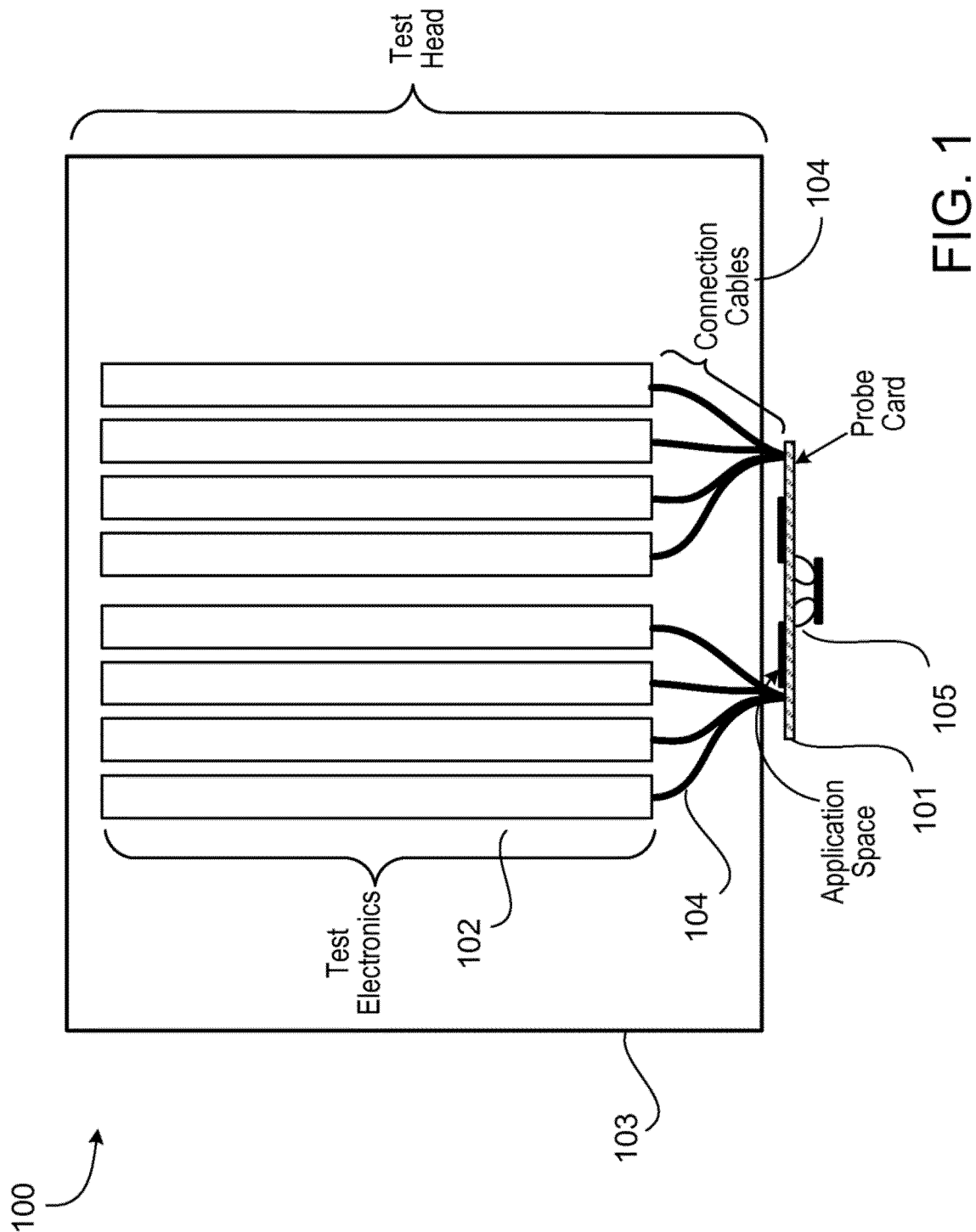

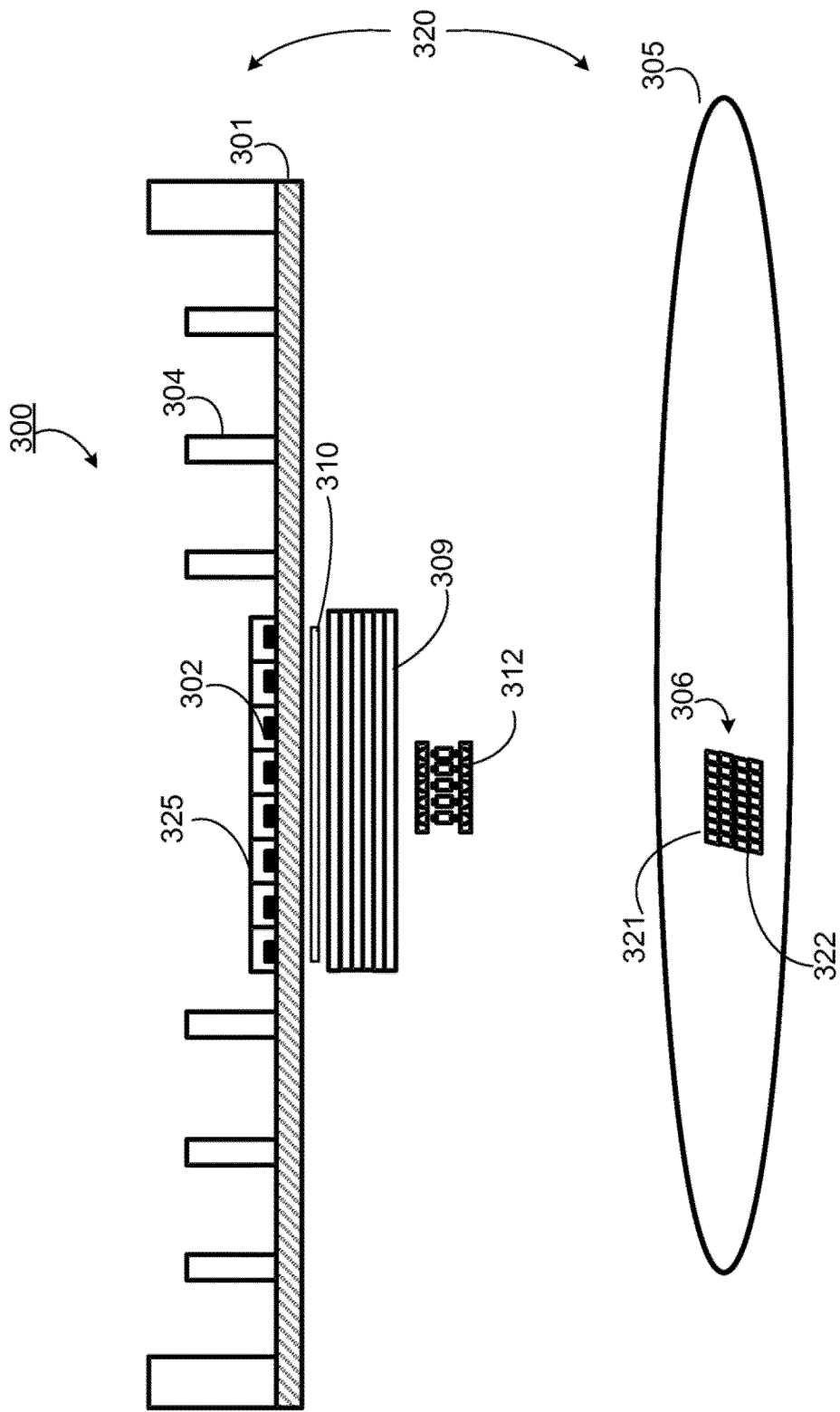

0: process begins with planar substrate
1: Patterned polymer is added to substrate
2: metallic layer is added on top of pattern
3: surface is planarized Steps 1-3 are repeated to make many layers 5: polymer is removed with a solvent

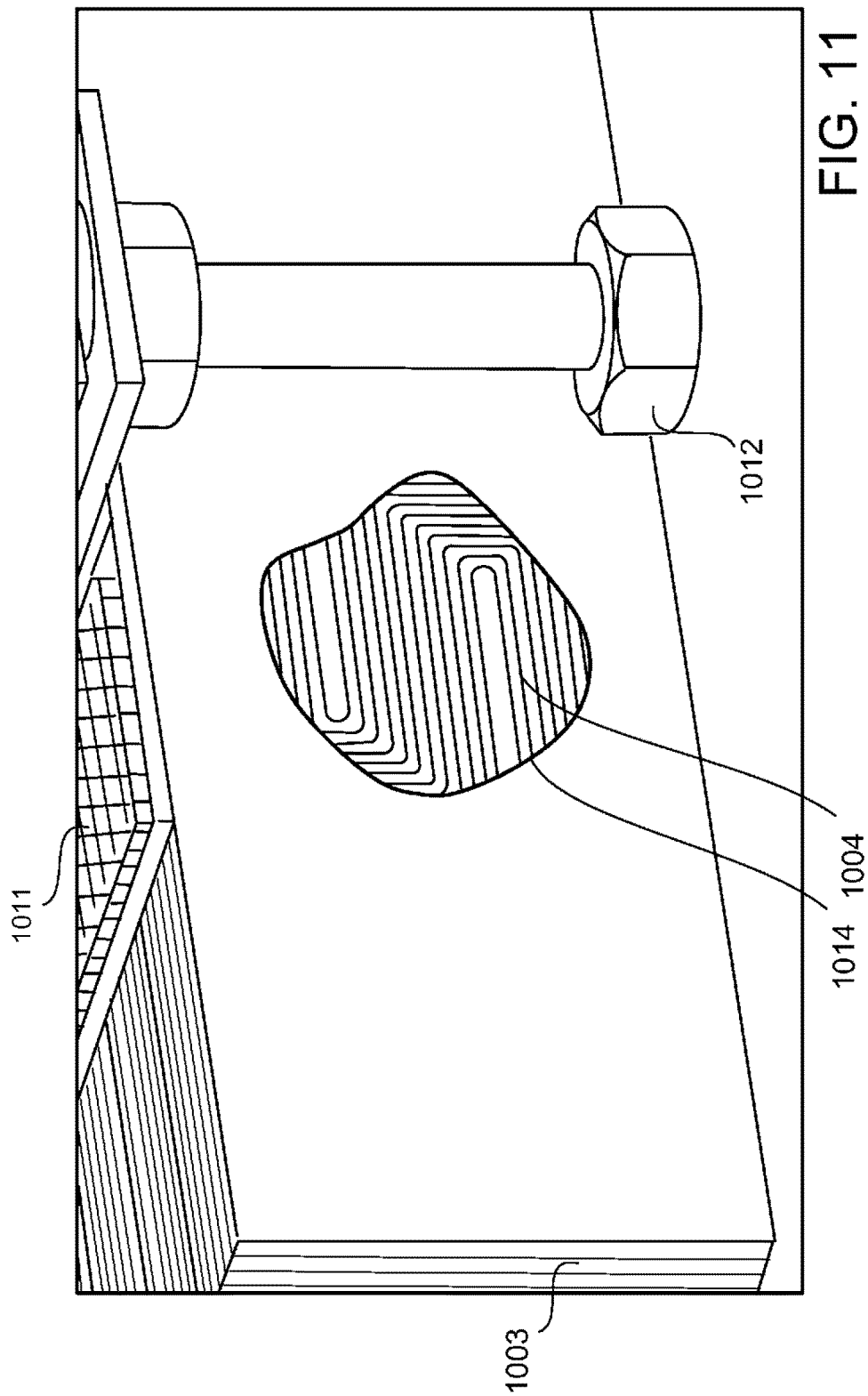

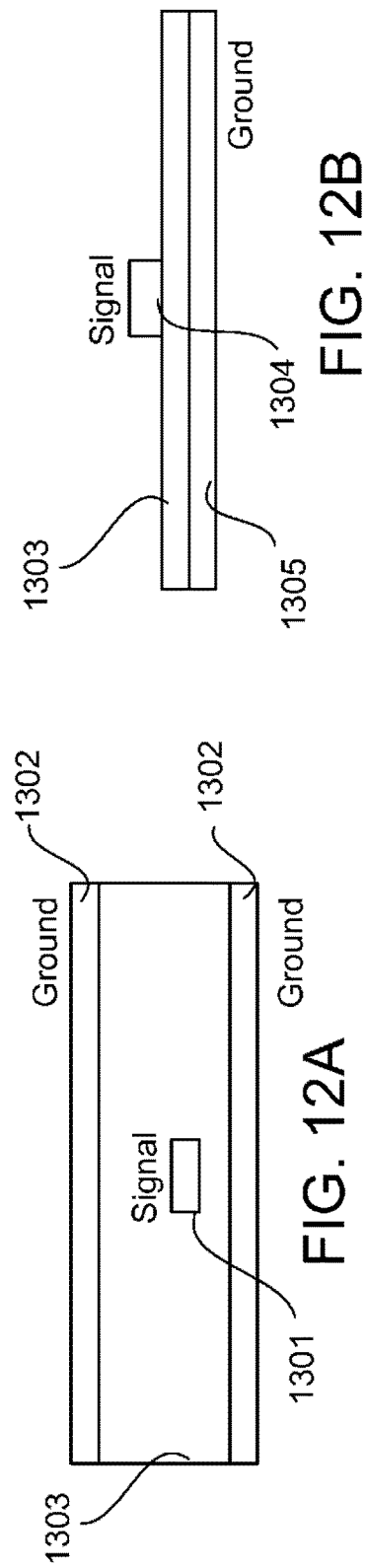
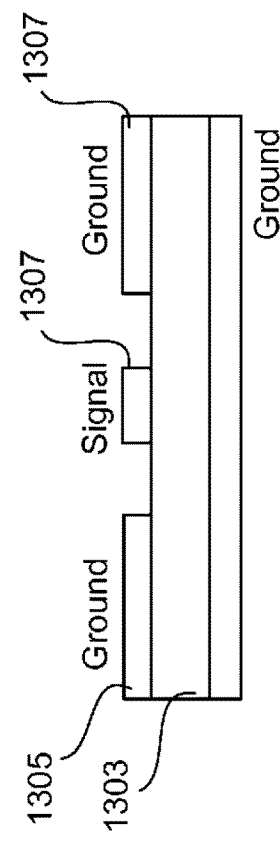
FIG. 12A
FIG. 12B
FIG. 12C